(12) United States Patent
Lee

(10) Patent No.: US 9,793,635 B2
(45) Date of Patent: Oct. 17, 2017

(54) CONNECTION STRUCTURAL MEMBER AND CONNECTION STRUCTURAL MEMBER MODULE, AND PROBE CARD ASSEMBLY AND WAFER TESTING APPARATUS USING THE SAME

(71) Applicant: Samsung Electronics Co., Ltd., Suwon-si, Gyeonggi-do (KR)

(72) Inventor: Jun-hee Lee, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/175,023

(22) Filed: Jun. 6, 2016

(65) Prior Publication Data

US 2017/0054240 A1    Feb. 23, 2017

(30) Foreign Application Priority Data

Aug. 20, 2015   (KR) ........................ 10-2015-0117338

(51) Int. Cl.
   *H01R 13/24*   (2006.01)
   *G01R 1/02*    (2006.01)
   *G01R 1/073*   (2006.01)
   *G01R 31/28*   (2006.01)
   *H01R 12/73*   (2011.01)
   *H01R 12/71*   (2011.01)

(52) U.S. Cl.
   CPC ........... *H01R 13/2421* (2013.01); *G01R 1/02* (2013.01); *G01R 1/07307* (2013.01); *G01R 31/2831* (2013.01); *H01R 12/714* (2013.01); *H01R 12/73* (2013.01); *H01R 13/2435* (2013.01); *H01R 2201/20* (2013.01)

(58) Field of Classification Search
   CPC ........... H01R 13/2421; H01R 13/2435; H01R 2201/20; H01R 12/714; H01R 12/73
   USPC ........................................... 439/700, 824, 66
   See application file for complete search history.

(56) References Cited

U.S. PATENT DOCUMENTS

| 6,130,545 | A   |   | 10/2000 | Kiser et al. |   |
|---|---|---|---|---|---|
| 6,677,772 | B1 | * | 1/2004  | Faull   | G01R 1/06722 324/755.05 |
| 7,102,369 | B2 |   | 9/2006  | Jung    |   |
| 7,445,459 | B2 | * | 11/2008 | Hsiao   | H01R 13/2421 439/66 |
| 7,458,818 | B2 | * | 12/2008 | Kiyofuji | G01R 1/07371 324/750.07 |
| 7,466,153 | B2 |   | 12/2008 | Kim     |   |
| 7,737,710 | B2 | * | 6/2010  | Cho     | G01R 1/0483 257/48 |

(Continued)

FOREIGN PATENT DOCUMENTS

| KR | 100695816 B1 | 3/2007 |
| KR | 20080047553 A | 5/2008 |

(Continued)

*Primary Examiner* — Tho D Ta
(74) *Attorney, Agent, or Firm* — Renaissance IP Law Group LLP

(57) ABSTRACT

An apparatus comprising: a barrel having an first hole and a second hole opposite to the first hole; a first plunger disposed in the first hole and including a hook shape; a second plunger disposed in the second hole; and an elastic connection member disposed within the barrel to connect the first plunger and the second plunger.

17 Claims, 28 Drawing Sheets

(56) References Cited

U.S. PATENT DOCUMENTS

| | | | |
|---|---|---|---|
| 7,946,855 B2* | 5/2011 | Osato | H01R 13/2421 |
| | | | 324/755.05 |
| 8,291,754 B2* | 10/2012 | Kammann | B60C 23/041 |
| | | | 73/146.5 |
| 2007/0057685 A1 | 3/2007 | Garabedian et al. | |
| 2007/0075717 A1 | 4/2007 | Kinghorn et al. | |
| 2007/0141877 A1* | 6/2007 | Lee | G01R 1/0466 |
| | | | 439/137 |
| 2013/0323864 A1 | 12/2013 | Mo et al. | |
| 2013/0342232 A1 | 12/2013 | Park | |
| 2014/0106626 A1* | 4/2014 | Frushour | H01R 13/2464 |
| | | | 439/824 |
| 2014/0118018 A1 | 5/2014 | Washio et al. | |
| 2015/0070038 A1 | 3/2015 | Joo et al. | |

FOREIGN PATENT DOCUMENTS

| | | |
|---|---|---|
| KR | 20100026450 A | 3/2010 |
| KR | 101058517 B1 | 8/2011 |
| KR | 20130136794 A | 12/2013 |
| KR | 101391794 B1 | 5/2014 |
| KR | 20140057163 A | 5/2014 |

* cited by examiner

CONNECTION STRUCTURAL MEMBER AND CONNECTION STRUCTURAL MEMBER MODULE, AND PROBE CARD ASSEMBLY AND WAFER TESTING APPARATUS USING THE SAME

CROSS-REFERENCE TO RELATED APPLICATION

This application claims the benefit of Korean Patent Application No. 10-2015-0117338, filed on Aug. 20, 2015, in the Korean Intellectual Property Office, the disclosure of which is incorporated herein in its entirety by reference.

BACKGROUND

Embodiments relate to a connection structural member and a connection structural member module, and a probe card assembly and a wafer testing apparatus using the same, and more particularly, to a connection structural member and a connection structural member module, which are capable of connecting structural members (structures), and a probe card assembly and a wafer testing apparatus using the same.

An electronic device may need a connection structural member so as to mechanically and electrically connect structural members. The structural members may have different coefficients of thermal expansion (CTE), and may be subjected to mechanical force. In this case, it may be difficult for the connection structural member to reliably connect the structural members mechanically and electrically.

SUMMARY

An embodiments includes an apparatus comprising: a barrel having an first hole and a second hole opposite to the first hole; a first plunger disposed in the first hole and including a hook shape; a second plunger disposed in the second hole; and an elastic connection member disposed within the barrel to connect the first plunger and the second plunger.

An embodiment includes a probe card assembly comprising: a circuit board connected to a test head; a support board disposed to face the circuit board; a connection structural member configured to connect connection pads respectively formed in the circuit board and the support board; a piezoelectric sensor disposed in at least one of the circuit board and the support board; and a probe disposed under the support board and configured to contact with a pad of a semiconductor chip, wherein the connection structural member includes a first plunger disposed at one end of a barrel and configured to have a hook shape, a second plunger disposed at the other end of the barrel opposite to the first plunger; and an elastic connection member disposed within the barrel to connect the first plunger and the second plunger.

An embodiment includes a wafer testing apparatus comprising: a test head configured to receive a test signal from a tester; and a probe card assembly configured to transmit the test signal from the test head to a semiconductor chip on a wafer, the probe card assembly including: a circuit board connected to the test head; a support board disposed to face the circuit board; a connection structural member configured to connect connection pads respectively formed in the circuit board and the support board; a piezoelectric sensor disposed in at least one of the circuit board and the support board; and a probe disposed under the support board and configured to come into contact with an electrode pad of the semiconductor chip on the wafer; wherein the connection structural member includes a first plunger disposed at one end of a barrel and configured to have a hook shape, a second plunger disposed at the other end of the barrel opposite to the first plunger; and an elastic connection member disposed within the barrel to connect the first plunger and the second plunger.

An embodiment includes an apparatus comprising: a first structural member; a second structural member; and a plurality of connection structural members disposed between the first structural member and the second structural member, each connection structural member including: a barrel having an first hole and a second hole opposite to the first hole; a first plunger disposed in the first hole and including a hook shape; a second plunger disposed in the second hole; and an elastic connection member disposed within the barrel to connect the first plunger and the second plunger; wherein the first structural member and the second structural member are electrically connected through the connection structural members.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
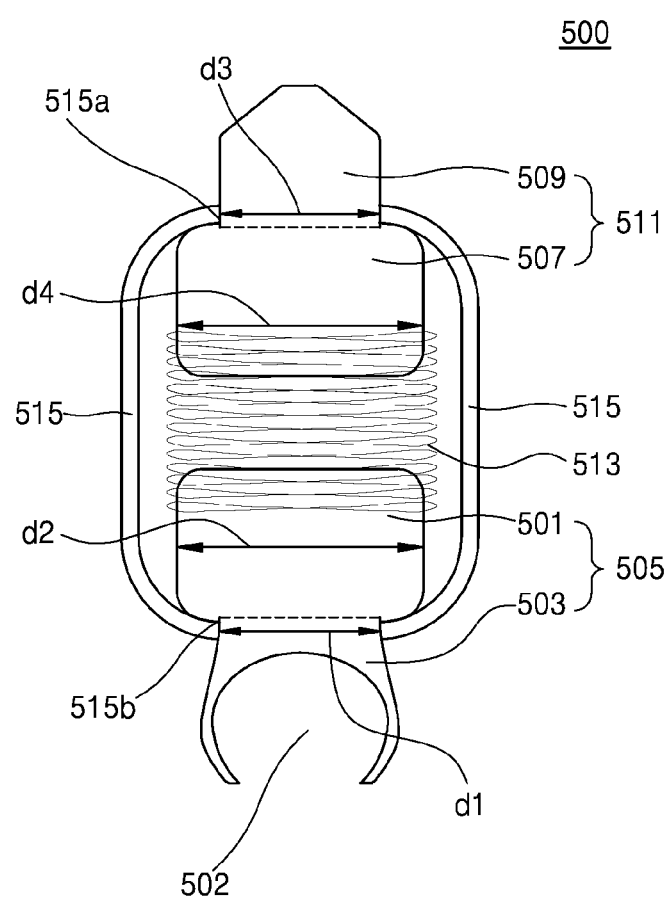
FIG. 1 is a cross-sectional view for describing a connection structural member according to an embodiment.

Hereinafter, embodiments will be described in detail with reference to the accompanying drawings. Embodiments may, however, take many different forms and should not be construed as being limited to the particular embodiments set forth herein; rather, these particular embodiments are provided so that this disclosure will be thorough and complete, and will fully convey the concept to those of ordinary skill in the art. As used herein, the term "and/or" includes any and all combinations of one or more of the associated listed items.

It will be understood that when an element, such as a layer, a region, or a substrate, is referred to as being "on" "connected to" or "coupled to" another element, it may be directly on, connected or coupled to the other element or intervening elements may be present. In contrast, when an element is referred to as being "directly on", "directly connected to" or "directly coupled to" another element or layer, there are no intervening elements or layers present. In the drawings, the dimensions of structures are exaggerated for convenience and clarity of the description, and parts having no relation to the description are omitted. Like reference numerals refer to like elements throughout. The terminology used herein is for the purpose of describing particular embodiments only and is not intended to be limiting of all embodiments.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the scope of other embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of all embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments will be described with reference to the drawings schematically illustrating idealized embodiments. In the accompanying drawings, the modifications of the illustrated shapes may be expected according to manufacturing technologies and/or tolerance. Therefore, the particular illustrated embodiments should not be construed as being limited to specific shapes of the illustrated regions. The shapes may be changed during the manufacturing processes.

The following embodiments may be implemented solely or in combination. Therefore, other embodiments should not be construed as being limited to any one particular embodiment.

FIG. 1 is a cross-sectional view for describing a connection structural member 500 according to an embodiment. The connection structural member 500 may include a barrel 515, a first plunger 505, a second plunger 511, and an elastic connection member 513. The connection structural member 500 may be a component that mechanically and electrically connects structural members, such as 531 and 533 of FIG. 5, which will be described below. The connection structural member 500 may be referred to as a pogo pin when used for a probe card assembly to be described below.

The barrel 515 may include an upper hole 515a and a lower hole 515b at an opposite side of the connection structural member 500 as the upper hole 515a. The upper hole 515a and the lower hole 515b may be relative to each other. For convenience, the upper hole 515a may refer to a hole positioned on upper side and the lower hole 515b may refer to a hole disposed on lower side; however, in other embodiments, the upper hole 515a and the lower hole 515b may be reversed. In other embodiments, the upper hole 515a may be a hole positioned on a left side and the lower hole 515b may be a hole positioned on the right side, for example, by rotating the connection structural member 500 counter clockwise. In this embodiment, the first plunger 505 is configured to have a hook-type and is disposed in the lower hole 515b. The first plunger 505 may extend through the lower hole 515b. The first hook-type plunger 505 may be referred to as a first ring-type plunger 505.

The first plunger 505 configured as a hook-type may include a first hook-type plunger body 501 disposed within the barrel 515 and having a diameter d2 larger than a diameter d1 of the lower hole 515b. The first plunger 505 configured as a hook-type may include a first hook member 503 connected to the first hook-type plunger body 501, protruding outside the barrel 515, and having a first inner spatial area 502. A connection ball, such as 517 in FIG. 5, may be disposed in the first inner spatial area 502 of the first hook member 503 as described below. The connection ball may be a conductive ball.

When the first hook member 503 is subjected to force in a vertical direction, the first hook member 503 may come into surface contact with the connection ball, such as 517 in FIG. 5, that is, may come into multipoint contact with the first connection ball 517, as described below. Therefore, the first hook member 503 may reliably connect structural members mechanically and electrically in a vertical direction with a reduced or eliminated eccentricity.

The second plunger 511 may be disposed in the upper hole 515a at an opposite side of the connection structural member 500 as the first plunger 505. The second plunger 511 may be disposed in the upper hole 515a at an opposite side of the connection structural member 500 as the lower hole 515b. In this embodiment, the second plunger 511 may be a pin-type plunger. The second plunger 511 configured as a pin-type may include a pin-type plunger body 507 disposed within the barrel 515 and having a diameter d4 larger than a diameter d3 of the upper hole 515a. The second plunger 511 configured as a pin-type may include a pin-type member 509 connected to the pin-type plunger body 507 and protruding outside the barrel 515. The second plunger 511 may extend through the upper hole 515a.

When the pin-type member 509 is subjected to force in a vertical direction, the pin-type member 509 may be reliably connected to structural members mechanically and electrically with reduced or eliminated eccentricity due to the first hook member 503 and the connection ball even when the pin-type member 509 comes into point contact with the structural members as described below.

The connection structural member 500 may include an elastic connection member 513 disposed within the barrel 515 to connect the first plunger 505 and the second plunger 511. The elastic connection member 513 may be formed to wrap a part of the first plunger 505 and a part of the second plunger 511. The elastic connection member 513 may be spaced apart from the barrel 515 and may include a spring member. When the first plunger 505 and the second plunger 511 are subjected to force in a vertical direction, the elastic connection member 513 may provide a shock-absorbing function.

Although a spring has been used as an example of the elastic connection member 513, other resilient structures may be used. For example, any type of compression spring may be used, such as a coil spring, an accordion spring, a wave spring, or the like. In addition, resilient structures other than springs may be used. For example, conductive microspheres embedded within a resilient material may be used as the elastic connection member 513. Furthermore, although the elastic connection member 513 has been described as wrapping around a portion of plungers, in other embodiments, the elastic connection member 513 may only contact a particular surface, such as a bottom or top surface of the plunger. In addition, although the elastic connection member 513 has been illustrated as separate from the barrel 515, in other embodiments, the elastic connection member 513 may contact the barrel.

Figure 5:
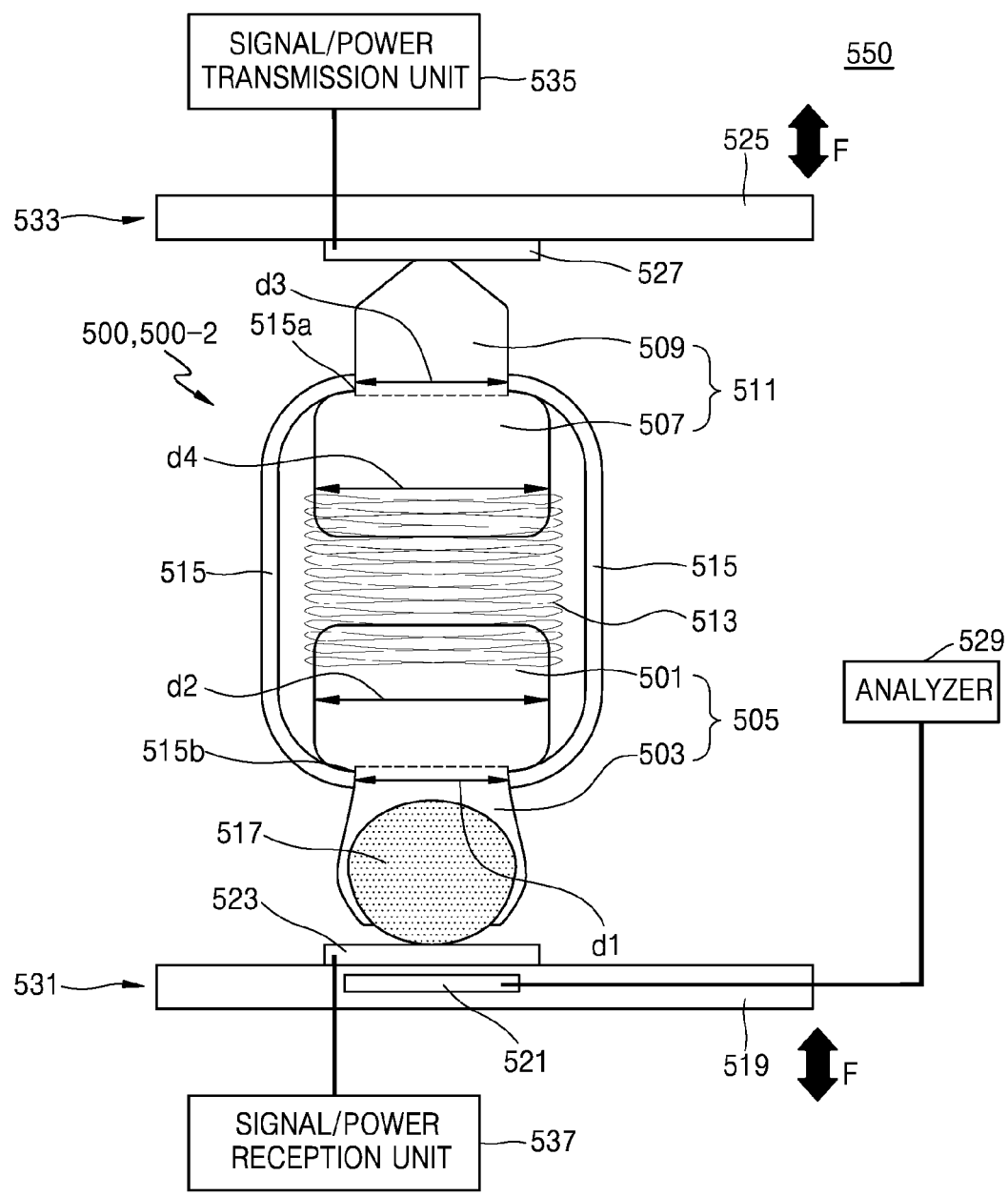
FIG. 5 is a cross-sectional view for describing a connection structural member module according to an embodiment.

As described above, the connection structural member 500 may reliably connect structural members, such as 531 and 533 of FIG. 5, mechanically and electrically in a vertical direction without eccentricity by using the first plunger 505 having the first hook member 503, the second plunger 511, and the elastic connection member 513.

For convenience, it is illustrated in FIG. 1 that the first plunger 505 configured to have a ring-type is disposed in the lower hole 515b of the barrel 515 and the second plunger 511 configured to have a pin-type is disposed in the upper hole 515a of the barrel 515. However, a plunger configured to have a pin-type may be disposed in the lower hole 515b of the barrel 515 and a plunger configured to have a ring-type may be disposed in the upper hole 515a of the barrel 515.

Figure 2:
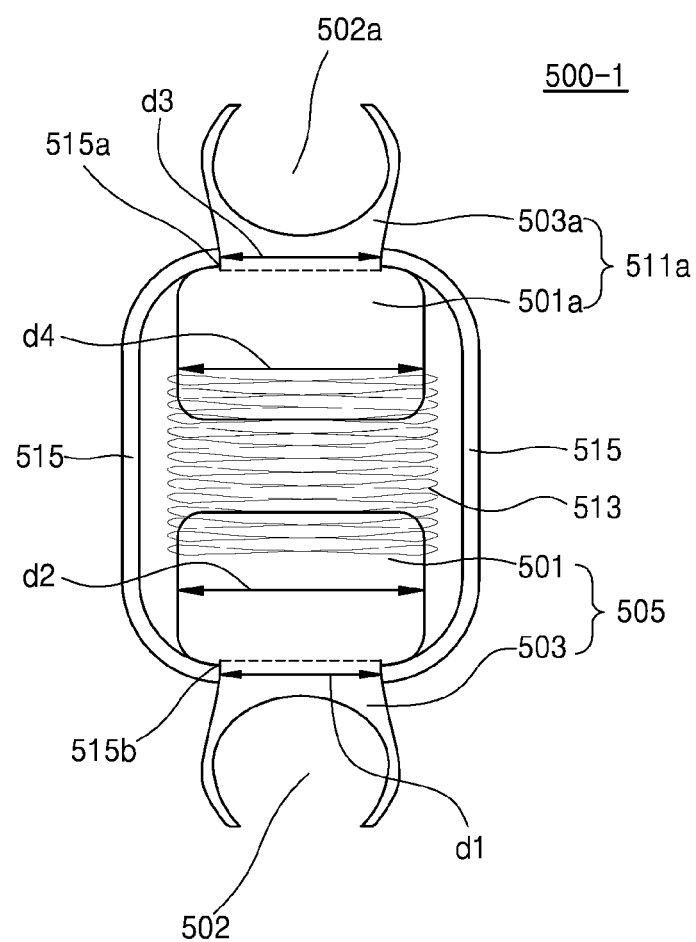
FIG. 2 is a cross-sectional view for describing a connection structural member according to an embodiment.

FIG. 2 is a cross-sectional view for describing a connection structural member 500-1 according to an embodiment. The connection structural member 500-1 is substantially identical to the connection structural member 500 of FIG. 1, except that a second plunger 511a is configured to have a hook-type. In FIG. 2, the same reference numerals as those of FIG. 1 denote the same members, and for convenience, parts described with reference to FIG. 1 will be described briefly or will be omitted.

The connection structural member 500-1 may include a barrel 515, a first plunger 505, a second plunger 511a and an elastic connection member 513. The connection structural member 500-1 may be a component that mechanically and electrically connects structural members, such as 531 and 533 of FIG. 5 as described below.

The first plunger 505 is configured to have a hook-type and is disposed in the lower hole 515b. The first plunger 505 configured to have a hook-type may include a first hook-type plunger body 501 having a diameter d2 larger than a diameter d1 of the lower hole 515b and a first hook member 503 connected to the first hook-type plunger body 501 and having a first inner spatial area 502. The first hook member 503 may be used to reliably connect structural members mechanically and electrically through a connection ball, such as 517 of FIG. 5, which may be formed in the first inner spatial area 502 as described below.

The second plunger 511a may be disposed in the upper hole 515a at an opposite side of the connection structural member 500-1 as the first plunger 505. In this embodiment, the second plunger 511a may be a hook-type plunger. The second plunger 511a configured as a hook-type may include a second hook-type plunger body 501a disposed within the barrel 515 and having a diameter d4 larger than a diameter d3 of the upper hole 515a. The second plunger 511a configured as a hook-type may include a second hook member 503a connected to the second hook-type plunger body 501a and having a second inner spatial area 502a.

A connection ball, such as 517a of FIG. 10, may be disposed in the second inner spatial area 502a of the second hook member 503a as described below. When the second hook member 503a is subjected to force in a vertical direction, the second hook member 503a may come into surface contact with the connection ball, such as 517a of FIG. 10, that is, may come into multipoint contact with the connection ball. Therefore, the second hook member 503a may reliably connect structural members, such as 531 and 533 of FIG. 10 mechanically and electrically without eccentricity.

The connection structural member 500-1 may include the elastic connection member 513 disposed within the barrel 515 to connect the first plunger 505 and the second plunger 511a. The elastic connection member 513 may be formed to wrap a part of the first plunger 505 and a part of the second plunger 511a. The elastic connection member 513 may be spaced apart from the barrel 515 and may include a spring member. When the first plunger 505 and the second plunger 511a are subjected to force in a vertical direction, the elastic connection member 513 may provide a shock-absorbing function.

Figure 10:
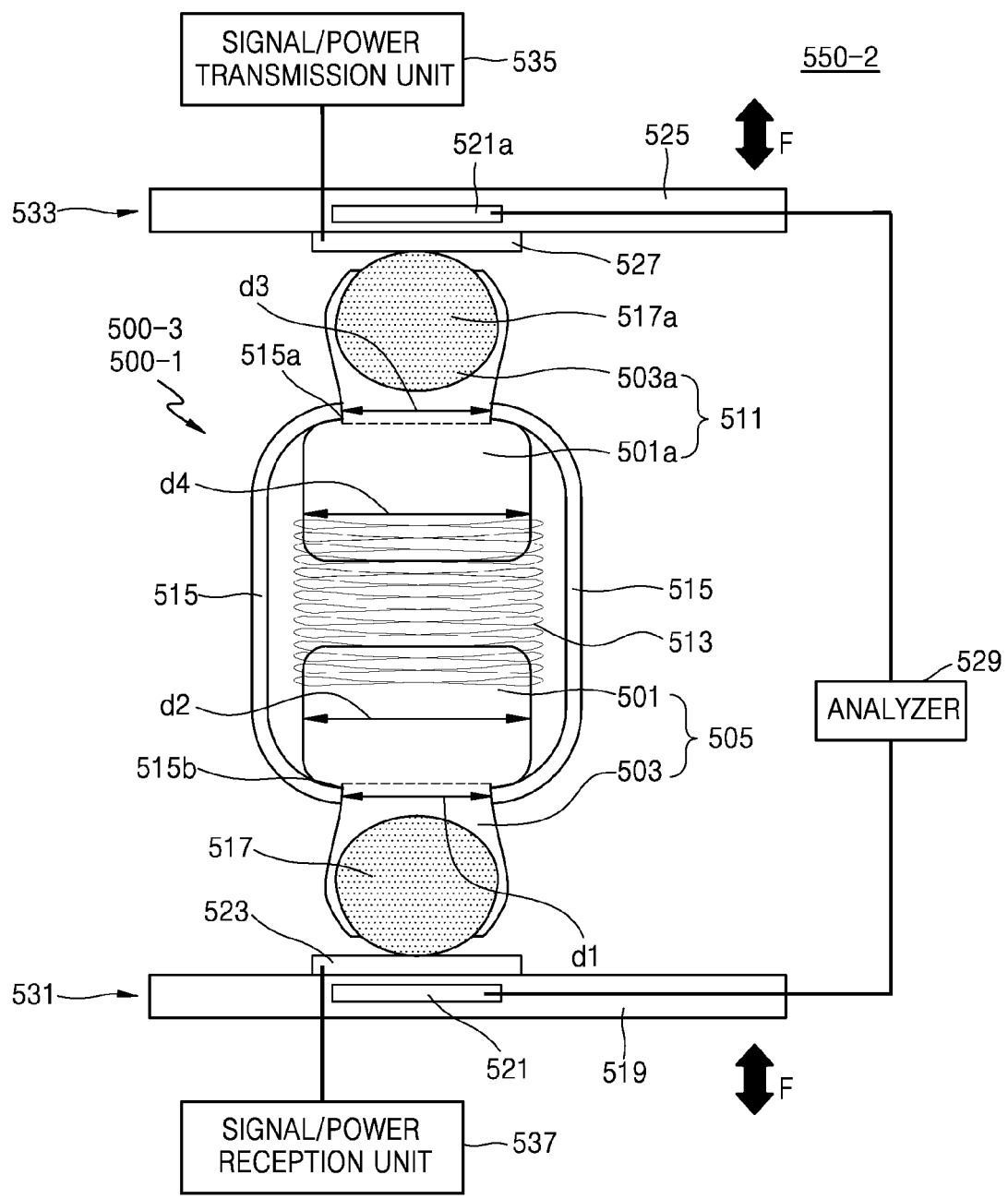
FIG. 10 is a cross-sectional view for describing a connection structural member module according to an embodiment.

As described above, the connection structural member 500-1 may reliably connect structural members, such as 531 and 533 of FIG. 10, mechanically and electrically in a vertical direction with reduced or eliminated eccentricity by using the first plunger 505 having the first hook member 503, the second plunger 511a having the second hook member 503a, and the elastic connection member 513.

Figure 3:
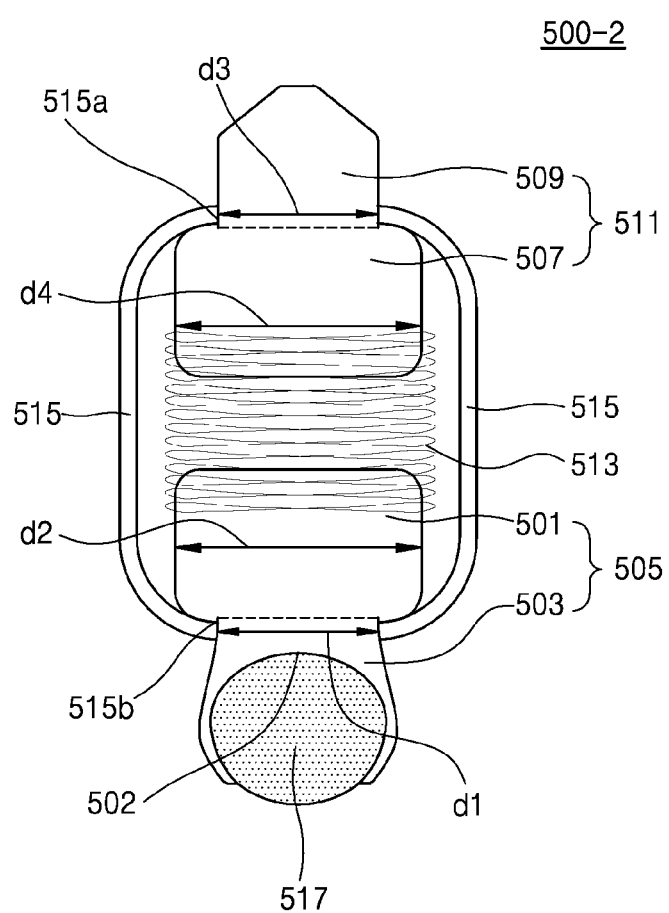
FIG. 3 is a cross-sectional view for describing a connection structural member according to an embodiment.

FIG. 3 is a cross-sectional view for describing a connection structural member 500-2 according to an embodiment. The connection structural member 500-2 is substantially identical to the connection structural member 500 of FIG. 1, except that a first connection ball 517 is further disposed within a first plunger 505 having a hook-type. In FIG. 3, the same reference numerals as those of FIG. 1 denote the same members, and for convenience, parts described with reference to FIG. 1 will be described briefly or will be omitted.

The connection structural member 500-2 may include a barrel 515, the first plunger 505, a second plunger 511 and an elastic connection member 513. The connection structural member 500-2 may be a component that mechanically and electrically connects structural members, such as 531 and 533 of FIG. 5 as described below.

The first plunger 505 is configured as a hook-type and is disposed in a lower hole 515b. As described above, the first plunger 505 configured as a hook-type may include a first hook-type plunger body 501 having a diameter d2 larger than a diameter d1 of the lower hole 515b and a first hook member 503 connected to the first hook-type plunger body 501 and having a first inner spatial area 502. The first connection ball 517 may be formed in the first inner spatial area 502 of the first hook member 503. The first connection ball 517 may be a conductive ball.

When the first hook member 503 is subjected to force in a vertical direction, the first hook member 503 may come into surface contact with the first connection ball 517, that is, may come into multipoint contact with the first connection ball 517, as described below. Therefore, the first hook member 503 may reliably connect structural members, such as 531 and 533 of FIG. 5, mechanically and electrically in a vertical direction with reduced or eliminated eccentricity.

The second plunger 511 may be disposed in the upper hole 515a on an opposite side of the connection structural member 500-2 as the first plunger 505. As described with reference to FIG. 1, the second plunger 511 may be a pin-type plunger. The second plunger 511 configured as a pin-type may include a pin-type plunger body 507 having a diameter d4 larger than a diameter d3 of the upper hole 515a and a pin-type member 509 connected to the pin-type plunger body 507 and protruding outside the barrel 515.

If the pin-type member 509 is subjected to force in a vertical direction, the pin-type member 509 may be reliably connected to structural members mechanically and electrically with reduced or eliminated eccentricity due to the first hook member 503 and the first connection ball 517 even when the pin-type member 509 comes into point contact with the structural members, such as 533 of FIG. 5 as described below.

The connection structural member 500-2 may include an elastic connection member 513 disposed within the barrel 515 to connect the first plunger 505 and the second plunger 511. When the first plunger 505 and the second plunger 511 are subjected to force in a vertical direction, the elastic connection member 513 may provide a shock-absorbing function.

As described above, the connection structural member 500-2 may reliably connect structural members, such as 531 and 533 of FIG. 5, mechanically and electrically with reduced or eliminated eccentricity by using the first plunger 505 including the first connection ball 517, the second plunger 511, and the elastic connection member 513.

Figure 4:
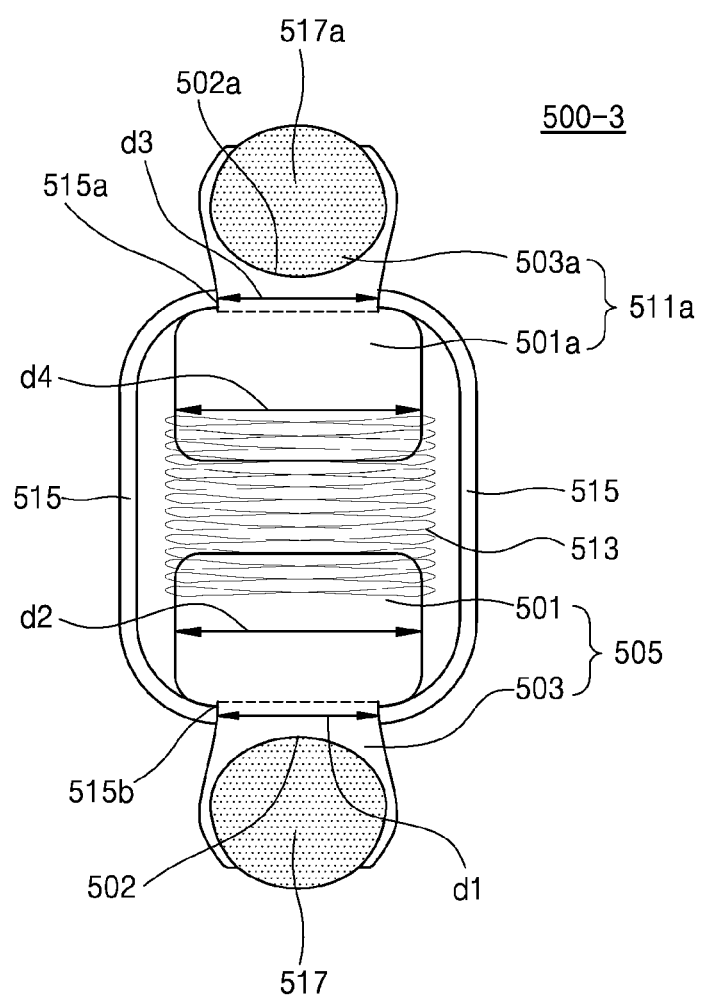
FIG. 4 is a cross-sectional view for describing a connection structural member according to an embodiment.

FIG. 4 is a cross-sectional view for describing a connection structural member 500-3 according to an embodiment. The connection structural member 500-3 may be substantially identical to the connection structural member 500-1 of FIG. 2, except that a first connection ball 517 and a second connection ball 517a are respectively disposed within a first plunger 505 configured as a hook-type and a second plunger 511a configured as a hook-type. In FIG. 4, the same reference numerals as those of FIG. 2 denote the same members, and for convenience, parts described with reference to FIG. 2 will be described briefly or will be omitted.

The connection structural member 500-3 may include a barrel 515, the first plunger 505, the second plunger 511a, and an elastic connection member 513. The connection structural member 500-3 may be a component that mechanically and electrically connects structural members, such as 531 and 533 of FIG. 10 as described below.

The first plunger 505 may be configured as a hook-type and may be disposed in a lower hole 515b. As described above, the first plunger 505 configured as a hook-type may include a first hook-type plunger body 501 having a diameter d2 larger than a diameter d1 of the lower hole 515b and a first hook member 503 connected to the first hook-type plunger body 501 and having a first inner spatial area 502. The first connection ball 517 may be formed in the first inner spatial area 502 of the first hook member 503.

When the first hook member 503 is subjected to force in a vertical direction, the first hook member 503 may come into surface contact with the first connection ball 517, that is, may come into multipoint contact with the first connection ball 517, as described below. Therefore, the first hook member 503 may reliably connect structural members mechanically and electrically through the first connection ball 517 in a vertical direction with reduced or eliminated eccentricity.

The second plunger 511a may be disposed in the upper hole 515a on an opposite side of the connection structural member 500-3 from the first plunger 505. As described with reference to FIG. 2, the second plunger 511a may be a hook-type plunger. The second plunger 511a configured as a hook-type may include a second hook-type plunger body 501a disposed within the barrel 515 and having a diameter d4 larger than a diameter d3 of the upper hole 515a. The second plunger 511a configured as a hook-type may include a second hook member 503a connected to the second hook-type plunger body 501a and having a second inner spatial area 502a.

The second connection ball 517a may be formed in the second inner spatial area 502a of the second hook member 503a. The second connection ball 517a may be a conductive ball. When the second hook member 503a is subjected to force in a vertical direction, the second hook member 503a may come into surface contact with the second connection ball 517a, that is, may come into multipoint contact with the second connection ball 517a, as described below. Therefore, the second hook member 503a may reliably connect structural members, such as 531 and 533 in FIG. 10, mechanically and electrically through the second connection ball 517a in a vertical direction with reduced or eliminated eccentricity.

The connection structural member 500-3 may include the elastic connection member 513 disposed within the barrel 515 to connect the first plunger 505 and the second plunger 511a. When the first plunger 505 and the second plunger 511a are subjected to force in a vertical direction, the elastic connection member 513 may provide a shock-absorbing function.

As described above, the connection structural member 500-3 may reliably connect structural members, such as 531 and 533 in FIG. 10, mechanically and electrically with reduced or eliminated eccentricity by using the first plunger 505 including the first connection ball 517, the second plunger 511a including the second connection ball 517a, and the elastic connection member 513.

A connection structural member module using the connection structural member 500, 500-1, 500-2, or 500-3 as described above according to an embodiment will be described below. The connection structural member module to be described below may include a connection structural member connecting structural members.

FIG. 5 is a cross-sectional view for describing a connection structural member module according to an embodiment. The connection structural member module 550 may include a first structural member 531, a second structural member 533 disposed to face the first structural member 531, a connection structural member 500 or 500-2 disposed between the first structural member 531 and the second structural member 533 to connect the first structural member 531 and the second structural member 533, and a first piezoelectric sensor 521 disposed in the first structural member 531. Since the connection structural member 500 or 500-2 has been described with reference to FIGS. 1 to 3 in detail, a brief description thereof will be given, or a description thereof will be omitted. In FIG. 5, the same reference numerals as those of FIGS. 1 and 3 denote the same members.

The first structural member 531 may include a support board 519. A first connection pad 523 may be formed on the support board 519 of the first structural member 531. The second structural member 533 may be a circuit board 525. A second connection pad 527 may be formed in the circuit board 525 constituting the second structural member 533.

The connection structural member 500 or 500-2 may mechanically and electrically connect the first connection pad 523 of the first structural member 531 and the second connection pad 527 of the second structural member 533. The connection structural member 500 or 500-2 may be referred to as a pogo pin when used for a probe card assembly as described below. The connection structural member 500 or 500-2 may include a first plunger 505 configured as a hook-type, placed on the first connection pad 523, and disposed at one end of the barrel 515 and a first connection ball 517 formed in the first hook member 503 of the first plunger 505.

The barrel 515 may have an upper hole 515a and a lower hole 515b on an opposite side of the connection structural member 500 or 500-2 from the upper hole 515a. The first plunger 505 may be configured as a hook-type and may be disposed in the lower hole 515b. The first plunger 505 may include a first hook-type plunger body 501 disposed within the barrel 515 and having a diameter d2 larger than a diameter d1 of the lower hole 515b. The first hook-type plunger body 501 may be connected to a first hook member 503 protruding outside the barrel 515.

The first connection ball 517 may be formed within the first hook member 503. The first connection ball 517 may be formed to have a solder ball shape on the first connection pad 523 of the support board 519. When the first connection ball 517 is implemented by using a solder ball, the first connection ball 517 is fitted into the first hook member 503 of the connection structural member 500 of FIG. 1.

When the first connection ball 517 is previously disposed within the first hook member 503 as in FIG. 3, the connection structural member 500-2 of FIG. 3 may come into contact with the first connection pad 523. Since the first hook member 503 is configured as a hook-type, the first hook member 503 may contact substantially the entire surface of the first connection ball 517. In other words, the first plunger 505 configured as a hook-type may be connected to the first connection ball 517 in such a way that the first plunger 505 comes into surface contact with the first connection ball 517.

When the first hook member 503 is subjected to force F in a vertical direction, the first hook member 503 may come into surface contact with the first connection ball 517, that is, may come into multipoint contact with the first connection ball 517. Therefore, the first hook member 503 may reliably connect a first structural member and a second structural member 533 mechanically and electrically through the first connection ball 517 in a vertical direction with reduced or eliminated eccentricity.

The connection structural member 500 or 500-2 may include a second plunger 511 disposed at the other end of the barrel 515 from the first plunger 505. The second plunger 511 may be disposed in the upper hole 515a of the barrel 515. The second plunger 511 may be configured as a pin-type. The second plunger 511 configured as a pin-type may include a pin-type plunger body 507 disposed within the barrel 515 and having a diameter d4 larger than a diameter d3 of the upper hole 515a.

The second plunger 511 may come into contact with a second connection pad 527 of a circuit board 525. Since the second plunger 511 includes a pin-type member 509, the pin-type member 509 may be connected to the second connection pad 527 in such a way that the pin-type member 509 comes into point contact with the second connection pad 527. In other words, the second plunger 511 configured as a pin-type may be connected to the second connection pad 527 in such a way that the second plunger 511 comes into point contact with the second connection pad 527.

In a case in which the pin-type member 509 is subjected to force F in a vertical direction, the pin-type member 509 may be reliably connected to the structural members 531 and 533 mechanically and electrically with reduced or eliminated eccentricity due to the first hook member 503 and the first connection ball 517 even when the pin-type member 509 comes into point contact with the second structural member 533. The connection structural member 500 or 500-2 may include an elastic connection member 513 disposed within the barrel 515 to connect the first plunger 505 and the second plunger 511.

A signal/power transmission unit 535 may be connected to the second connection pad 527. A signal/power reception unit 537 may be connected to the first connection pad 523. Therefore, a signal and power applied to the second connection pad 527 may be transmitted to the first connection pad 523 through the connection structural member 500 or 500-2.

A piezoelectric sensor 521 may be disposed in the support board 519 of the first structural member 531. The first piezoelectric sensor 521 may be formed in the support board 519 of the first structural member 531. The first piezoelectric sensor 521 may be formed under the first connection pad 523. The first piezoelectric sensor 521 may be connected to an analyzer 529.

The analyzer 529 may be configured to measure a contact resistance between the first structural member 531 and the connection structural member 500 or 500-2, and analyze whether the contact resistance is in an appropriate range. In other words, the analyzer 529 may measure a contact resistance between the first connection pad 523 on the support board 519 and the first connection ball 517 of the connection structural member 500 or 500-2, and analyze whether the contact resistance is in an appropriate range.

Figure 6:
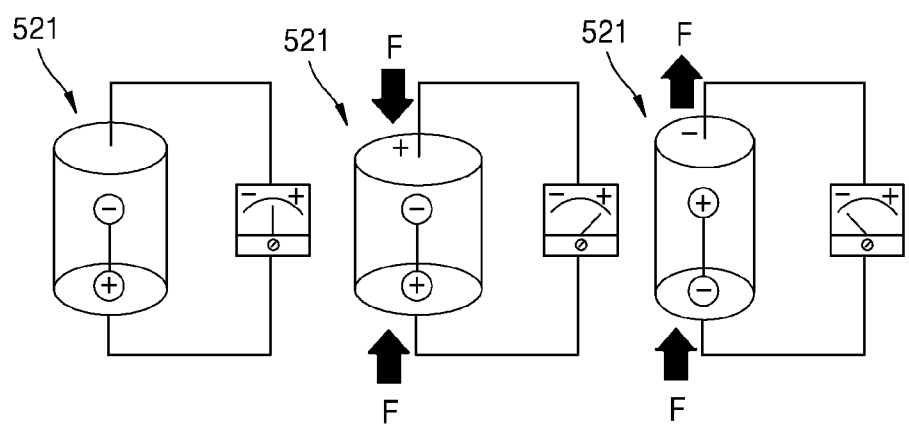
FIGS. 6 and 7 are diagrams for describing piezoelectric effect of a first piezoelectric sensor illustrated in FIG. 5.
Figure 7:
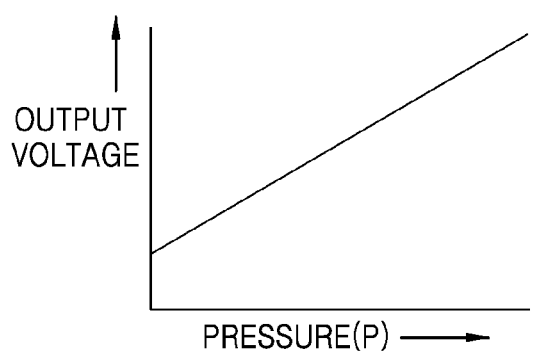

FIGS. 6 and 7 are diagrams for describing piezoelectric effect of the first piezoelectric sensor illustrated in FIG. 5. As illustrated in FIG. 6, an output voltage may not be generated in a state in which there is no external stress with respect to the first piezoelectric sensor 521. However, as illustrated in FIG. 6, when compression force F is applied to the first piezoelectric sensor 521, a positive (+) voltage and a negative (−) voltage may be respectively generated at upper and lower electrodes. As illustrated in FIG. 6, when tension force F is applied to the first piezoelectric sensor 521, a negative (−) voltage and a positive (+) voltage may be respectively generated at the upper and lower electrodes.

As illustrated in FIG. 7, when a pressure P of the compression force F or the tension force F is applied to the first piezoelectric sensor 521, an output voltage of the first piezoelectric sensor 521 may increase. When the compression force F or the tension force F is applied to the first piezoelectric sensor 521, the compression force F or the tension force F may be converted into an electrical signal. A piezoelectric material forming the first piezoelectric sensor 521 may be formed as a thin film-type, and may include, for example, ZnO, CdS, AlN, or PZT (Pb(Zr, Ti)O$_3$).

When the output voltage is measured through the analyzer, such as 529 in FIG. 5, by using the first piezoelectric sensor 521, it is possible to measure the contact resistance between the first structural member 531 illustrated in FIG. 5 and the connection structural member 500 or 500-2. In the case of measuring the contact resistance between the first structural member 531 and the connection structural member 500 or 500-2, it is possible to evaluate whether contact between the first structural member 531 and the connection structural member 500 or 500-2 is appropriate, through the analyzer, such as 529 in FIG. 5.

Figure 8:
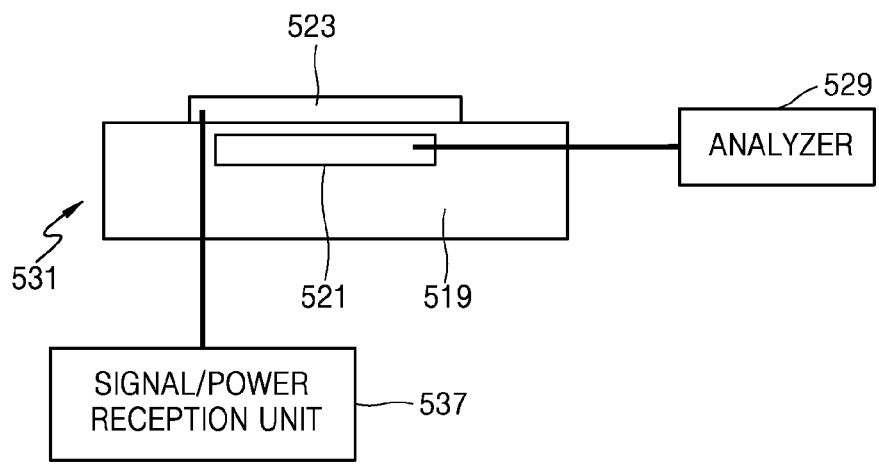
FIG. 8 is a diagram for describing positions at which the first piezoelectric sensor and a first connection pad of FIG. 5 are formed.

FIG. 8 is a diagram for describing positions at which the first piezoelectric sensor and the first connection pad of FIG. 5 are formed. The first connection pad 523 may be disposed on the support board 519. The first piezoelectric sensor 521 may be formed under the first connection pad 523. The first piezoelectric sensor 521 may be disposed in the support board 519. The first piezoelectric sensor 521 may be connected to the analyzer 529. The first connection pad 523 may be connected to the signal/power reception unit 537.

Due to the above-described configuration, a signal and power may be received by the first connection pad 523 through the connection structural member 500 or 500-2, such as in FIG. 5, and the first piezoelectric sensor 521 disposed in the support board 519 may be connected to the analyzer 529. Therefore, the analyzer 529 may measure a contact resistance between the first structural member 531 and the connection structural member 500 or 500-2, and analyze whether the contact resistance is in an appropriate range.

Figure 9:
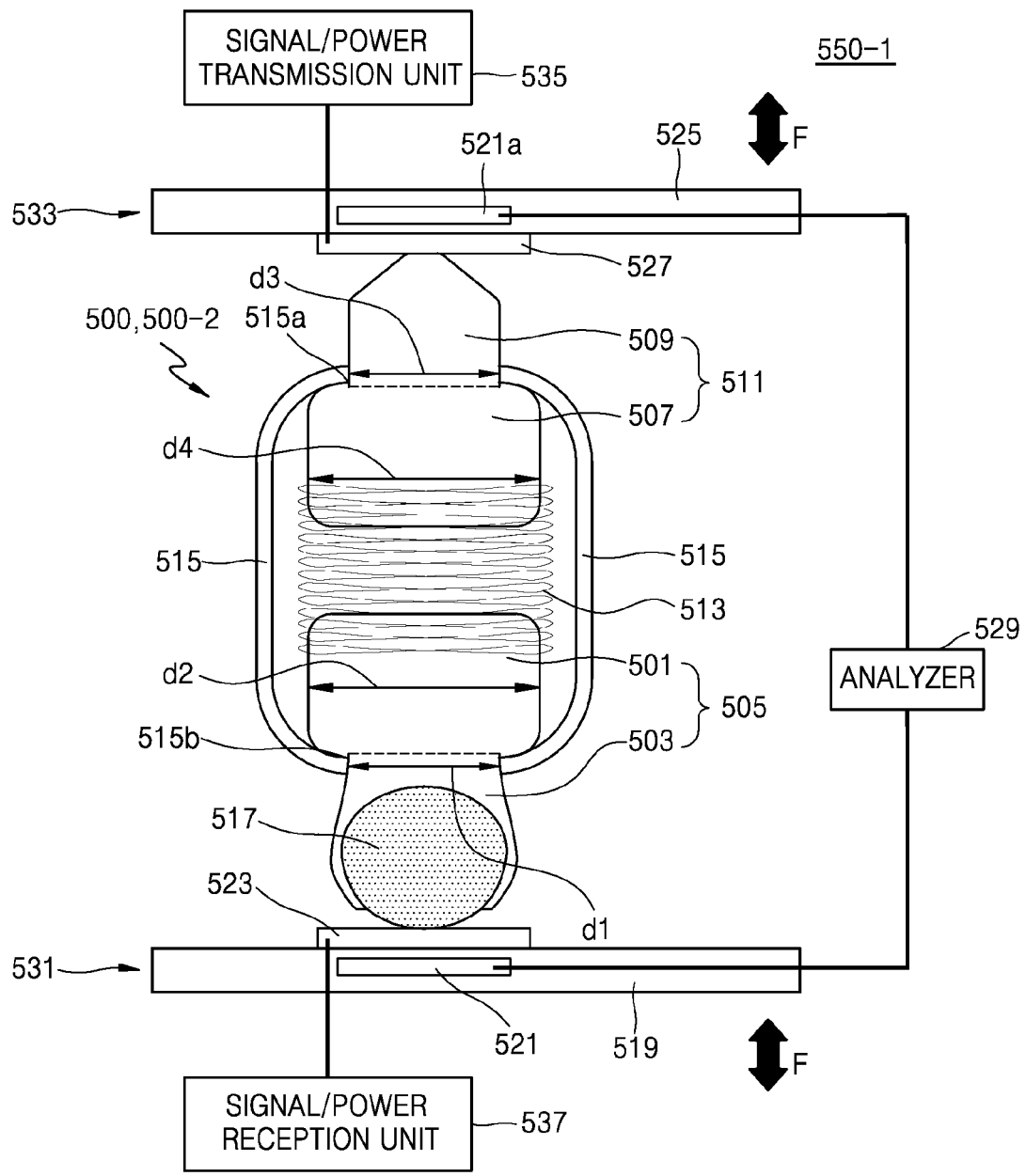
FIG. 9 is a cross-sectional view for describing a connection structural member module according to an embodiment.

FIG. 9 is a cross-sectional view for describing a connection structural member module 550-1 according to an embodiment. The connection structural member module 550-1 may be substantially identical to that in FIG. 5, except that a second piezoelectric sensor 521a is disposed in the circuit board 525 of the second structural member 533. In FIG. 9, the same reference numerals as those of FIG. 5 denote the same members, and parts described with reference to FIG. 5 will be described briefly or will be omitted.

The connection structural member module 550-1 may include a first structural member 531, a second structural member 533 disposed to face the first structural member 531, a connection structural member 500 or 500-2 disposed between the first structural member 531 and the second structural member 533 to connect the first structural member 531 and the second structural member 533, a first piezoelectric sensor 521 disposed in the first structural member 531, and a second piezoelectric sensor 521a disposed in the second structural member 533. The second piezoelectric sensor 521a may have substantially the same configuration and effect as the first piezoelectric sensor 521.

The first piezoelectric sensor 521 and the second piezoelectric sensor 521a both may be connected to the analyzer 529. The analyzer 529 may be configured to measure a contact resistance between the first structural member 531 or the second structural member 533 and the connection structural member 500 or 500-2, and analyze whether the contact resistance is in an appropriate range.

In other words, the analyzer 529 may be configured to measure a contact resistance between the first connection pad 523 on the support board 519 and the first connection ball 517 of the connection structural member 500 or 500-2, and a contact resistance between the second connection pad 527 on the circuit board 525 and the connection structural member 500 or 500-2 and analyze whether each contact resistance is in an appropriate range.

FIG. 10 is a cross-sectional view for describing a connection structural member module 550-2 according to an embodiment. The connection structural member module 550-2 may be substantially identical to that in FIG. 5, except that the connection structural member 500-1 or 500-3 described with reference to FIGS. 2 to 4 is used, and a second piezoelectric sensor 521a is disposed in the circuit board 525 of the second structural member 533. In FIG. 10, the same reference numerals as those of FIG. 2, 4 or 5 denote the same members, and parts described with reference to FIG. 2, 4 or 5 will be described briefly or will be omitted.

The connection structural member module 550-2 may include a first structural member 531, a second structural member 533 disposed to face the first structural member 531, a connection structural member 500-1 or 500-3 disposed between the first structural member 531 and the second structural member 533 to connect the first structural member 531 and the second structural member 533, a first piezoelectric sensor 521 disposed in the first structural member 531, and a second piezoelectric sensor 521a disposed in the second structural member 533. The second piezoelectric sensor 521a may have substantially the same configuration and effect as the first piezoelectric sensor 521. The connection structural member 500-1 or 500-3 may be referred to as a pogo pin when used for a probe card assembly as described below.

The connection structural member 500-1 or 500-3 may include a first plunger 505 configured as a hook-type, placed on the first connection pad 523, and disposed at one end of the barrel 515, and a first connection ball 517 formed in the first hook member 503 of the first plunger 505. The barrel 515 may have an upper hole 515a and a lower hole 515b on an opposite side of the connection structural member 500-1 or 500-3 from the upper hole 515a. The first plunger 505 may be configured as a hook-type and may be disposed in the lower hole 515b.

When the first hook member 503 is subjected to force F in a vertical direction, the first hook member 503 may come into surface contact with the first connection ball 517, that is, may come into multipoint contact with the first connection ball 517. Therefore, the first hook member 503 may reliably connect the first structural member 531 and the second structural member 533 mechanically and electrically in a vertical direction with reduced or eliminated eccentricity.

The connection structural member 500-1 or 500-3 may include a second plunger 511 disposed at the other end of the barrel 515 on an opposite of the connection structural member 500-1 or 500-3 from the first plunger 505. The second plunger 511 may be disposed in the upper hole 515a of the barrel 515. The second plunger 511 may include a second hook-type plunger body 501a disposed within the barrel 515 and having a diameter d4 larger than a diameter d3 of the upper hole 515a. The second hook-type plunger body 501a may be connected to a second hook member 503a protruding outside the barrel 515.

The second connection ball 517a may be formed within the second hook member 503a. The second connection ball 517a may be formed to have a solder ball shape on the second connection pad 527 of the circuit board 525. When the second connection ball 517a is implemented by using a solder ball, the second connection ball 517a is fitted into the second hook member 503a of the connection structural member 500-2 of FIG. 2.

When the second connection ball 517a is disposed within the second hook member 503a as in FIG. 4, the connection structural member 500-3 of FIG. 4 may come into contact with the second connection pad 527. Since the second hook member 503a may be configured to have a ring-type, the second hook member 503a may come into contact with substantially the entire surface of the second connection ball 517a. The second plunger 511 configured to have a hook-type may be connected to the second connection ball 517a in such a way that the second plunger 511 comes into surface contact with the second connection ball 517a.

When the second hook member 503a is subjected to force F in a vertical direction, the second hook member 503a may come into surface contact with the second connection ball 517a, that is, may come into multipoint contact with the second connection ball 517a. Therefore, the second hook member 503a may reliably connect the first structural member 531 and the second structural member 533 mechanically and electrically in a vertical direction with reduced or eliminated eccentricity. The connection structural member 500-1 or 500-3 may include an elastic connection member 513 disposed within the barrel 515 to connect the first plunger 505 and the second plunger 511.

The first piezoelectric sensor 521 and the second piezoelectric sensor 521a both may be connected to the analyzer 529. The analyzer 529 may be configured to measure a contact resistance between the first structural member 531 or the second structural member 533 and the connection structural member 500-1 or 500-3, and analyze whether the contact resistance is in an appropriate range.

In other words, the analyzer 529 may be configured to measure a contact resistance between the first connection pad 523 on the support board 519 and the first connection ball 517 of the connection structural member 500 or 500-3, and a contact resistance between the second connection pad 527 disposed on the circuit board 525 and the second connection ball 517a of the connection structural member 500 or 500-3 and analyze whether each contact resistance is in an appropriate range.

Figure 11:
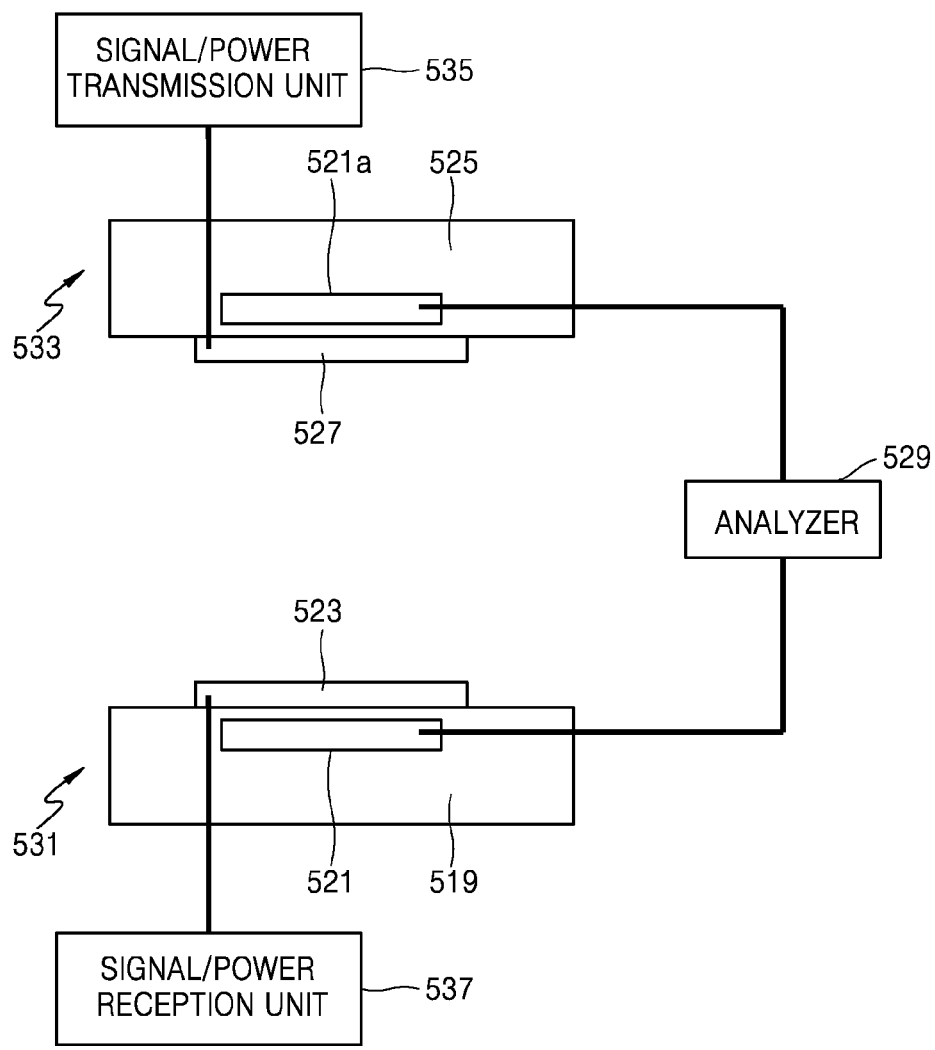
FIG. 11 is a diagram for describing positions at which a first piezoelectric sensor and a first connection pad of FIG. 10 are formed and positions at which a second piezoelectric sensor and a second connection pad of FIG. 10 are formed.

FIG. 11 is a diagram for describing positions at which the first piezoelectric sensor and the first connection pad of FIG. 10 are formed and positions at which the second piezoelectric sensor and the second connection pad of FIG. 10 are formed.

The first connection pad 523 may be disposed on the support board 519. The first piezoelectric sensor 521 may be formed under the first connection pad 523. The first piezoelectric sensor 521 may be disposed in the support board 519. The first piezoelectric sensor 521 may be connected to the analyzer 529. The first connection pad 523 may be connected to the signal/power reception unit 537.

The second connection pad 527 may be disposed on a lower surface of the circuit board 525. The second piezoelectric sensor 521a may be disposed over the second connection pad 527. The second piezoelectric sensor 521a may be disposed in the circuit board 525. The second piezoelectric sensor 521a may be connected to the analyzer 529. The second connection pad 527 may be connected to the signal/power transmission unit 535.

A signal and power generated by the signal/power transmission unit 535 may be received by the first connection pad 523 through the second connection pad 527 and the connection structural member, such as 500-1 or 500-3 in FIG. 10. The signal and power received by the first connection pad 523 may be input to the signal/power reception unit 537.

The first piezoelectric sensor 521 and the second piezoelectric sensor 521a respectively disposed in the support board 519 and the circuit board 525 may be connected to the analyzer 529. Therefore, the analyzer 529 may measure a contact resistance between the first structural member 531 and the connection structural member, such as 500-1 or 500-3 in FIG. 10, and a contact resistance between the second structural member 533 and the connection structural member, such as 500-1 or 500-3 in FIG. 10, and analyze whether the contact resistance is in an appropriate range.

An embodiment of a probe card assembly and a wafer testing apparatus which use the connection structural member 500, 500-1, 500-2, or 500-3 and the connection structural member module 550, 550-1, or 550-2 as described above, will be described below. The probe card assembly which will be described below may include a connection structural member module. The wafer testing apparatus which will be described below may include a probe card assembly, and may have various types. An example of the wafer testing apparatus is illustrated in FIGS. 12 and 13.

Figure 12:
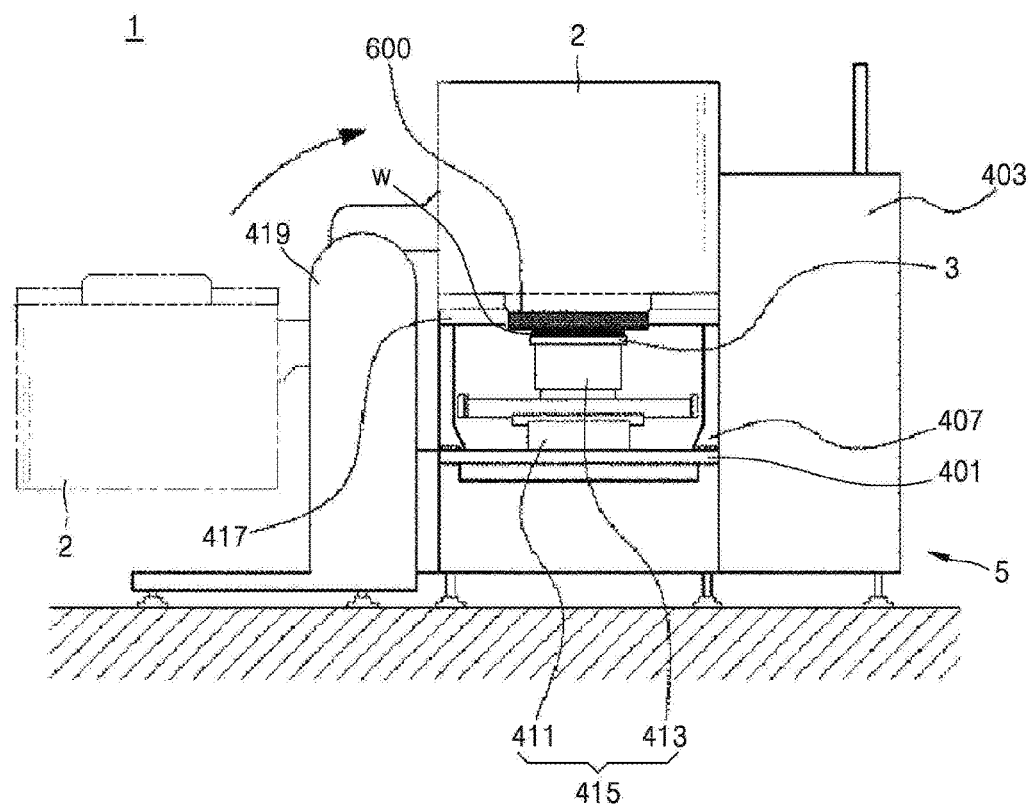
FIG. 12 is a cross-sectional view illustrating a wafer testing apparatus including a probe card assembly according to an embodiment.
Figure 13:
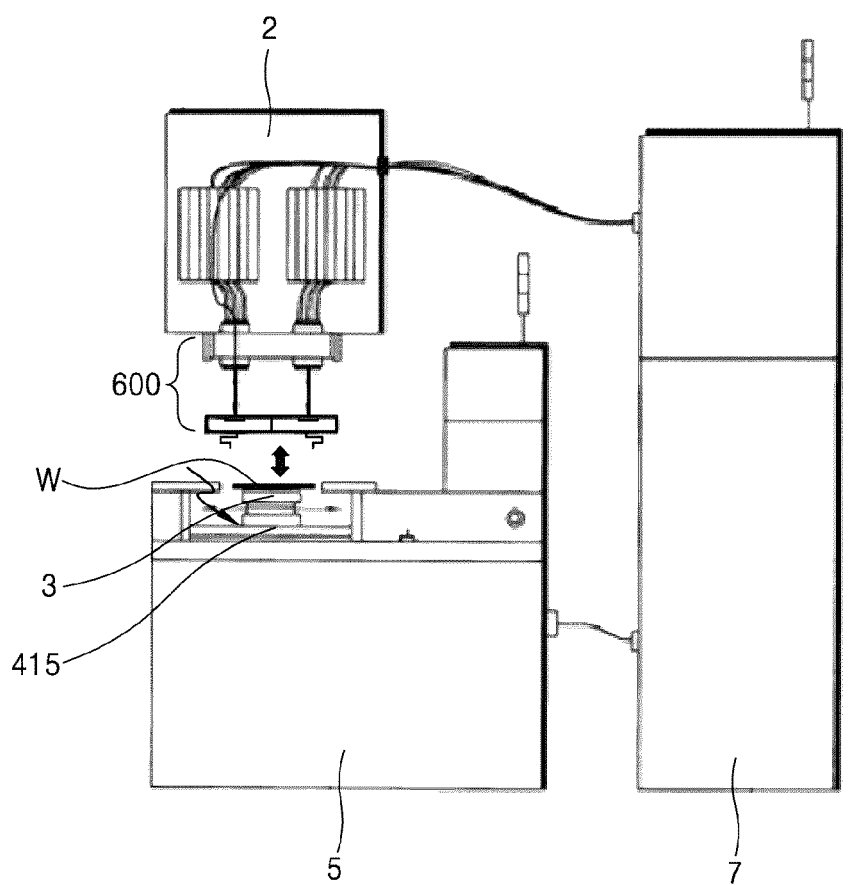
FIG. 13 is a cross-sectional view illustrating a wafer testing apparatus including a probe card assembly according to an embodiment.

FIG. 12 is a cross-sectional view illustrating a wafer testing apparatus including a probe card assembly according to an embodiment. The wafer testing apparatus 1 may include a test head capable of applying an electrical signal to a semiconductor chip provided in a wafer to test electrical characteristics thereof and a probe station 5 having a probe card assembly 600 so as to transmit the electrical signal applied by the test head 2 to the semiconductor chip.

The test head 2 and the probe station 5 may be controlled by a tester (not illustrated). The probe card assembly 600 may use the connection structural member module 550, 550-1, or 550-2 as described above. The probe card assembly 600 will be described below in detail.

Figure 14:
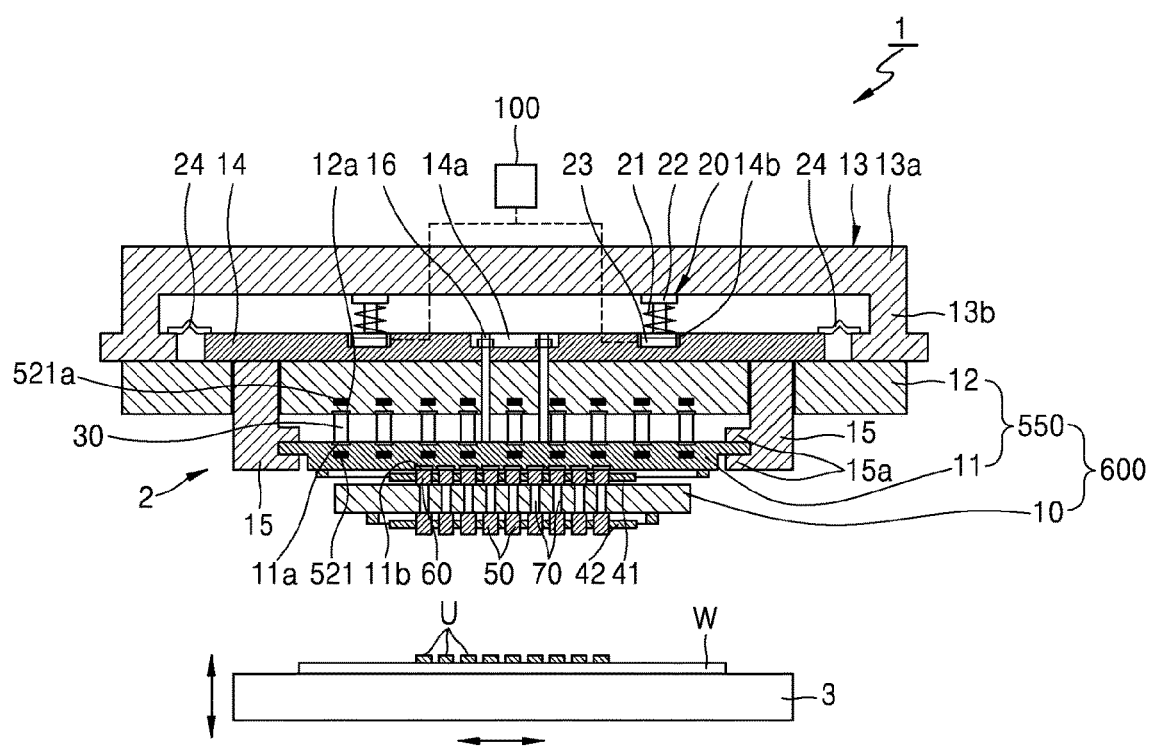
FIGS. 14 and 15 are enlarged cross-sectional view of a wafer testing apparatus including the probe card assembly of FIGS. 12 and 13.

A circuit board levelling portion, such as 20 in FIG. 14, may be disposed in a lower portion of the test head 2. The test head 2 may be disposed in a manipulator 419. The probe station 5 may include a base frame 401, a support pillar 407 formed in edges of the base frame 401, and a probe card assembly holder 417 disposed on the support pillar 407. The probe card assembly 600 may be disposed in the probe card assembly holder 417 on the support pillar 407.

The probe station 5 may include a chuck transfer portion 415 and a loader 403. The chuck transfer portion 415 may be disposed over the base frame 401. A chuck 3 on which the wafer W is placed is disposed on the chuck transfer portion 415. The chuck transfer portion 415 may include an XY stage 411 which moves the chuck 3 in a horizontal direction, such as an X and/or Y direction, and a Z stage 413 which moves the chuck 3 in a vertical direction, such as upward and downward in a Z direction. The loader 403, which may be configured to transfer the wafer W to be tested to the chuck 3, may be disposed at one side of the chuck transfer portion 415.

The test head 2 may be configured to rotate the manipulator 419 in the arrow direction by driving the manipulator 419, allowing the test head 2 to come into contact with the probe card assembly 600. In addition, the chuck transfer portion 415 may move the chuck in horizontal and vertical directions, allowing the wafer W to come into contact with the probe card assembly 600. When the wafer W comes into contact with the probe card assembly 600, a semiconductor chip on the wafer W may be tested.

When the test head 2 comes into contact with the probe card assembly 600, a weight of the test head 2 may be transferred to the probe card assembly 600 and the wafer W. The weight of the test head 2, that is, a pressure due to the test head 2 may need to be substantially, if not entirely uniformly applied to the probe card assembly 600 and the wafer W. Therefore, a circuit board levelling portion, such as 20 in FIG. 14 may be disposed in the test head 2 so as to adjust the level of the circuit board connected to the probe card assembly 600.

FIG. 13 is a cross-sectional view illustrating a wafer testing apparatus including a probe card assembly according to an embodiment. According to an embodiment, in the wafer testing apparatus 1a of FIG. 13, the test head 2 is not provided in the manipulator, unlike FIG. 12. The wafer testing apparatus 1a of FIG. 13 may include a tester 7, a probe station 5, a test head 2, and a probe card assembly 600. The tester 7 may be configured to generate a test current (or test signal) for testing electrical characteristics of a semiconductor chip provided in a wafer.

The probe station 5 may include a chuck transfer portion 415 capable of transferring a chuck 3. The chuck transfer portion 415 may be configured to move the chuck 3 in a horizontal direction, such as an X and/or Y direction, and a vertical direction, such as upward and downward in a Z direction. The wafer W may be placed on the chuck 3.

The probe card assembly 600 may be electrically connected to the tester 7. The test head 2 may be disposed over the probe card assembly 600. The test head 2 may be connected to the tester 7 to receive a test signal.

The probe card assembly 600 may be disposed in the test head 2 and may electrically come into contact with a semiconductor chip provided in the wafer W. The test head 2 and the probe station 5 may be controlled by the tester 7. The probe card assembly 600 may use the connection structural member module 550, 550-1, 550-2, or the like as described above.

Figure 15:
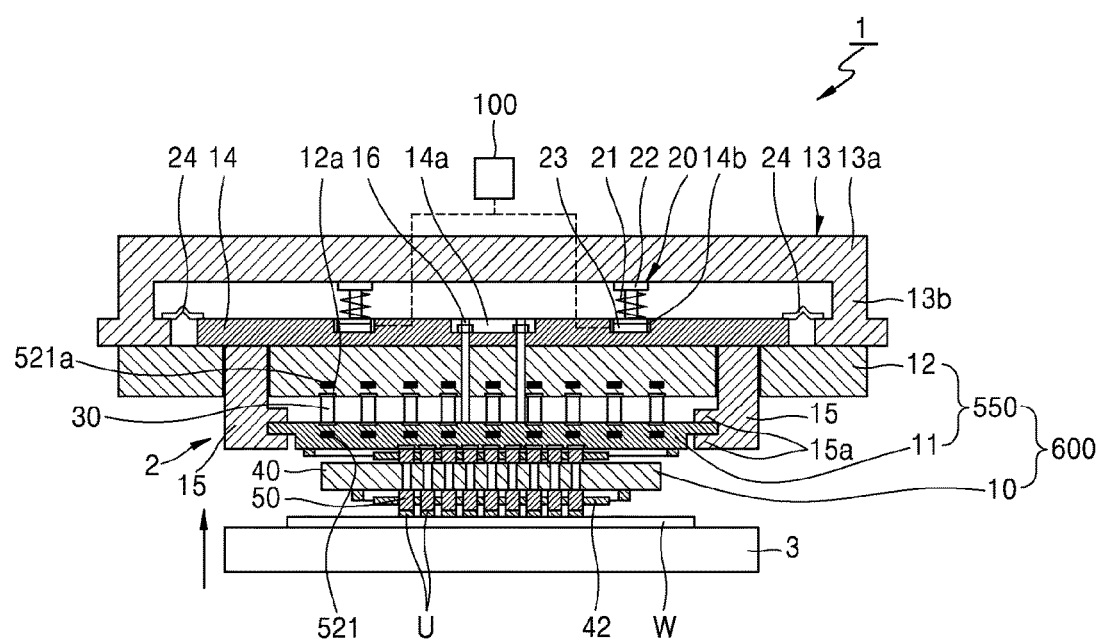
Figure 16:
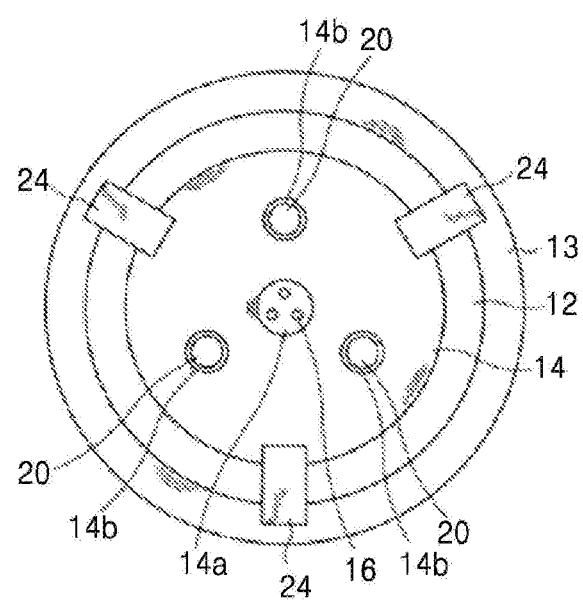
FIG. 16 is a plan view illustrating a circuit board and a connection plate of FIGS. 14 and 15 when viewed from above.
Figure 17:
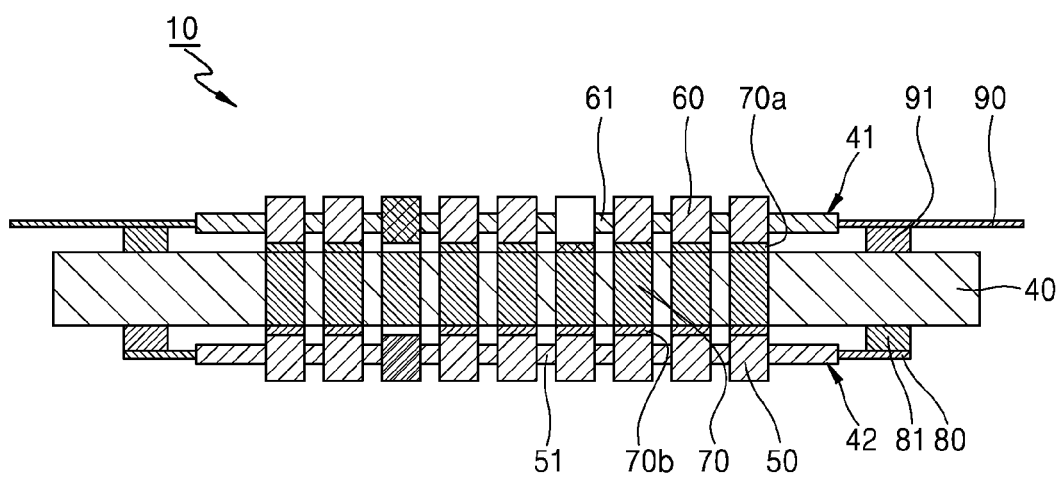
FIG. 17 is a cross-sectional view illustrating a configuration of a card-type probe of FIGS. 14 and 15.

FIGS. 14 and 15 are enlarged cross-sectional views of a wafer testing apparatus including a probe card assembly of FIGS. 12 and 13. FIG. 16 is a plan view illustrating a circuit board of FIGS. 14 and 15 and a connection plate when viewed from above. FIG. 17 is a cross-sectional view illustrating a configuration of a card-type probe of FIGS. 14 and 15.

As described above, in the wafer testing apparatus 1, a chuck 3 on which a wafer W is placed as a test target may be disposed under the test head 2. The wafer testing apparatus 1 will be used as an example below, however, in other embodiments, the wafer testing apparatus may be similar to the wafer testing apparatus 1, 1a, or the like. The test head 2 may be disposed over the chuck 3 and the chuck 3 may be moved upward and downward. The test head 2 may be formed to have substantially a disc shape. FIG. 14 illustrates a state in which the test head 2 is spaced apart from the chuck on which the wafer W is placed. FIG. 15 illustrates a state in which the card-type probe 10 of the test head 2 comes into contact with an electrode pad U of the wafer W due to upward movement of the chuck 3.

The test head 2 may include a support board 11, which supports the card-type probe 10 against the lower surface thereof, and a circuit board 12 disposed on the upper surface of the support board 11 to transmit an electrical signal for testing (test signal) to the card-type probe 10 when the card-type probe 10 comes into contact with the electrode pad U of the wafer W at the time of test. The support board 11 of FIGS. 14 and 15 may correspond to, for example, the support board 519 of the first structural member 531 of FIGS. 5, 9 and 10. The circuit board 12 of FIGS. 14 and 15 may correspond to, for example, the circuit board 525 of the second structural member 533 of FIGS. 5, 9 and 10.

An electronic circuit (not illustrated) for transmitting the electrical signal for testing (test signal) to the card-type probe 10 may be mounted in the circuit board 12. The electrical signal for testing may be transmitted to or received from the card-type probe 10 through the electronic circuit of the circuit board 12. The connection pad 12a may be disposed in the lower surface of the circuit board 12, and the connection pad 12a may be formed as a part of the electronic circuit of the circuit board 12.

A reinforcement member 13 which reinforces the circuit board 12 may be disposed on the upper surface of the circuit board 12. The reinforcement member 13 may include a main body portion 13a disposed above the circuit board 12 in parallel with the circuit board 12 and a fixing portion 13b extending downwardly from an outer peripheral portion of the main body portion 13a to fix an outer peripheral portion of the circuit board 12. The fixing portion 13b on the circuit board 12 may protrude toward both the inside and the outside of the circuit board 12.

The connection plate 14 connected to the support board 11 may be disposed on the upper surface of the circuit board 12 parallel to the circuit board 12. The connection plate 14 may be formed to have a disc shape having a diameter smaller than a diameter of the circuit board 12. The connection plate 14 may be disposed under the main body portion 13a of the reinforcement member 13 and inside the fixing portion 13b. The connection plate 14 may come into close contact with the upper surface of the circuit board 12, calibrating flatness of the circuit board 12.

A connection pillar 15 for connecting and integrating the support board 11 and the connection plate 14 may be fixed to a lower surface of the outer peripheral portion of the connection plate 14. The connection pillar 15 may be formed to have a rectangular pillar shape which extends in a vertical direction. The connection pillar 15 may be disposed at multiple positions, for example, four positions in the outer peripheral portion of the support board 11. When viewed from above, the connection pillars 15 may be arranged at equal intervals on the same circumference of a circle with the center of the support board 11 as the center thereof.

The connection pillar 15 may pass through the circuit board 12 in a thickness direction, and a lower end thereof may reach outer positions of the peripheral portion of the support board 11. Two protrusions 15a each protruding in a horizontal direction toward the support board 11 and configured to grab the peripheral portion of the support board 11 may be respectively disposed in lower portions of the connection pillars 15. The protrusion 15a may be a plate spring member.

The protrusion 15a may press the support board 11 against the circuit board 12 while grabbing the outer peripheral portion of the support board 11, maintaining an electrical contact between the support board 11 and the circuit board 12. As illustrated in FIG. 16, multiple bolts 16, such as three bolts 16, are disposed in a central portion of an upper surface of the connection plate 14.

As illustrated in FIGS. 14 and 15, upper ends of the bolts 16 may be disposed in a first recessed portion 14a formed in the central portion of the upper surface of the connection plate 14. The bolts 16 may pass through the circuit board 12 in a thickness direction and lower ends thereof may be fixed to the upper surface of the support board 11. The support board 11 may be connected to the connection plate 14 through the connection pillars 15 and the bolts 16.

A circuit board levelling portion 20 which substantially uniformly maintains a contact load between the card-type probe 10 and the electrode pad U may be disposed in the upper surface of the connection plate 14. The circuit board levelling portion 20 may include a spring member as a circuit board load adjustment member 21. As illustrated in FIG. 16, multiple, for example, three circuit board levelling portions 20 may be provided. When viewed from above, the circuit board levelling portions 20 may be arranged at equal intervals on the same circumference of a circle with the center of the connection plate 14 as the center thereof. As illustrated in FIGS. 14 and 15, the circuit board levelling portion 20 may be disposed in a second recessed portion 14b formed in the upper surface of the connection plate 14.

The circuit board levelling portion 20 may include a circuit board load adjustment member 21 including a spring member disposed to extend in a vertical direction, a support portion 22 configured to support circuit board load adjustment member 21 and extendable in a vertical direction, and a circuit board load sensor 23 configured to measure a load on the circuit board 12. The circuit board load sensor 23, which is configured to measure a load on the circuit board 12, may be disposed in the second recessed portion 14b. The circuit board levelling portions 20 may come into contact with the reinforcement member 13 and substantially uniformly maintain a contact load between the card-type probe 10 and the electrode pad U at a predetermined load.

Since multiple circuit board levelling portions 20 are provided, it is possible to make in-plane distribution of the contact load between the card-type probe 10 and the electrode pad U substantially uniform even when the card-type probe 10 comes into contact with the electrode pad U at different heights. The number of the circuit board levelling portions 20 is not limited to that described in this embodiment, and may be three or more. A load controller 100 may be connected to the circuit board load sensor 23. The load controller 100 may perform control such that a load on the circuit board 12 is equally a predetermined value, based on a measurement result of the circuit board load sensor 23.

For example, control may be performed to change the contact load between the card-type probe 10 and the electrode pad U by changing a height of the chuck 3, remove a failure cause when an abnormal load value is measured, for example, a slope of the support board 11, or the like. A predetermined contact load may be set based on a material and dimension of the card-type probe 10, for example, materials and thicknesses of an upper elastic sheet 41 and a lower elastic sheet 42, a diameter and the number of conductive portions 50, or the like.

A plate spring member 24 serving as an elastic member is disposed in the outer peripheral portion of the connection plate 14. One end of the plate spring member 24 may be fixed to the outer peripheral portion of the connection plate 14, and the other end may be fixed to the fixing portion 13b of the reinforcement member 13. As illustrated in FIG. 16, multiple, for example, three plate spring members 24 may be provided. When viewed from above, the plate spring members 24 may be arranged at equal intervals on the same circumference of a circle with the center of the connection plate 14 as the center thereof.

A position of the support board 11 in a horizontal direction may be fixed by the plate spring member 24. That is, even when the support board 11 supporting the card-type probe 10 is subjected to force in a horizontal direction in a state in which the card-type probe 10 comes into contact with the electrode pad U, the support board 11 may not move in a horizontal direction due to the plate spring member 24. The case in which the support board 11 is subjected to force in a horizontal direction may include a case of slightly moving a wafer W in a horizontal direction so as to obtain good contact in a state in which the card-type probe 10 comes into contact with the electrode pad U. The number of the plate spring members 24 is not limited to that of this embodiment, and may be three or more.

As illustrated in FIGS. 14 and 15, the support board 11 may be disposed to face the chuck 3 and may be arranged in parallel to the circuit board 12. Multiple connection pads 11a are disposed in the upper surface of the support board 11. The connection pads 11a may be formed to correspond to arrangement of the connection pads 12a in the lower surface of the circuit board 12. The connection pads 11a and the connection pads 12a of FIG. 14 may correspond to the first connection pads 523 and the second connection pads 527 of FIGS. 5, 9 and 10, for example.

Multiple connection structural members 30 may be disposed between the connection pads 11a of the support board 11 and the connection pads 12a of the circuit board 12 corresponding to the connection pads 11a so as to provide electrical conduction between relevant connection pads 11a or 12a. The connection structural member 30 of FIGS. 14 and 15 may correspond to the connection structural member 500, 500-1, 500-2, and 500-3 of FIGS. 5, 9 and 10, for example. Since the connection structural member 30 has been described above, a description thereof will be omitted.

The connection structural members 30 may be arranged to be uniformly distributed in the upper surface of the support board 11 without deflection. Each of the connection structural members 30 may be individually formed to extend in a vertical direction. Therefore, even when the card-type probe 10 comes into contact with the electrode pad U at different heights, the connection structural members 30 may make in-plane distribution of a contact load between the card-type probe 10 and the electrode pad U more uniform.

The connection pads 11b may be disposed in the lower surface of the support board 11 to have a narrower pitch than the connection pads 11a in the upper surface. The connection pads 11b, of which the number is equal to the number of the connection pads 11a in the upper surface, may be disposed in the lower surface. The connection pad 11a in the upper surface may be electrically connected to the corresponding connection pad 11b in the lower surface. The support board 11 may function as a pitch conversion board which changes an interval between the connection pads 12a of the circuit board 12.

A first piezoelectric sensor 521 may be disposed in the support board 11. A second piezoelectric sensor 521a may be disposed in the circuit board 12. Since the functions and effects of the first piezoelectric sensor 521 and the second piezoelectric sensor 521a have been described with reference to FIG. 5, a description thereof will be omitted. The support board 11, the circuit board 12, a connection structural member 30, a first piezoelectric sensor 521, and a second piezoelectric sensor 521a may constitute the connection structural member module 550 of FIG. 5. Although the connection structural member module 550 is denoted by reference numeral 550 in FIGS. 14 and 15 for convenience, the connection structural member module 550 may be denoted by reference numeral 550-1 or 550-2.

As illustrated in FIG. 17, the card-type probe 10 supported in the lower surface of the support board 11 may have a three-layered structure including an intermediate board 40 having a flat plate shape, for example, as an intermediate member, an upper elastic sheet 41 attached to an upper surface of the intermediate board 40, and a lower elastic sheet 42 attached to a lower surface of the intermediate board 40. Multiple conductive portions 50 having conductivity may be formed in the lower elastic sheet 42.

The conductive portions 50 may be formed to correspond to arrangement of electrode pads U of a wafer W. Each of the conductive portions 50 may pass through the lower elastic sheet 42, convexly protrude from upper and lower surfaces of the lower elastic sheet 42, and have a rectangular pillar shape. A portion other than the conductive portions of the lower elastic sheet 42 may be an insulating portion 51 formed of a rubber sheet.

The upper elastic sheet 41 may be formed of an insulating material having elasticity, for example, a rubber sheet, like the lower elastic sheet 42. Multiple conductive portions 60 having conductivity may be formed in the upper elastic sheet 41. The conductive portions 60 may be arranged to correspond to, for example, the arrangement of the connection pads 11b on the lower surface of the support board 11. Each of the conductive portions 60 may pass through the upper elastic sheet 41 in a vertical direction and convexly protrude from upper and lower surfaces of the upper elastic sheet 41. A portion other than the conductive portions 60 of the upper elastic sheet 41 may be an insulating portion 61.

The intermediate board 40 may have a rigidity higher than that of the upper elastic sheet 41 and the lower elastic sheet 42. Multiple conductive paths 70 leading from the lower surface to the upper surface of the intermediate board 40 may be formed in the intermediate board 40. The conductive paths 70 may be formed to have a straight line shape in a thickness direction of the intermediate board 40. A connection pad 70a may be formed at an upper end of the conductive path 70 and a connection pad 70b may be formed at a lower end of the conductive path 70.

The conductive path 70 of the intermediate board 40 may be formed at a position at which the conductive portion 50 of the lower elastic sheet 42 corresponds to the conductive portion 60 of the upper elastic sheet 41 in a one-to-one relationship. Therefore, the connection pad 70b of the conductive path 70 may correspond to the conductive portion 50 of the lower elastic sheet 42. The connection pad 70b of the conductive path 70 may correspond to the conductive portion 60 of the upper elastic sheet 41

The lower elastic sheet 42 may be fixed to a metal frame 80 surrounding an outer peripheral portion thereof. The metal frame 80 may have a rectangular rim shape according to the outer peripheral portion of the lower elastic sheet 42. The metal frame 80 may be adhered to a lower surface of the outer peripheral portion of the intermediate board 40 by, for example, adhesive 81 having elasticity. Therefore, each of the conductive portions 50 of the lower elastic sheet 42 may come into contact with the connection pad 70b of the conductive path 70 of the intermediate board 40.

The upper elastic sheet 41 may be fixed to a metal frame 90 surrounding an outer peripheral portion thereof. The metal frame 90 may have a rectangular rim shape according to the outer peripheral portion of the upper elastic sheet 41. The metal frame 90 may be adhered to an upper surface of the outer peripheral portion of the intermediate board 40 by, for example, adhesive 91 having elasticity. Therefore, each of the conductive portions 60 of the upper elastic sheet 41 may come into contact with the connection pad 70a of the conductive path 70 of the intermediate board 40.

The chuck 3 may be moveable in horizontal and vertical directions, and may three-dimensionally transfer a wafer W placed thereon. The support board 11, the circuit board 12, a connection structural member 30, a first piezoelectric sensor 521, a second piezoelectric sensor 521a, and a card-type probe 10 may constitute a probe card assembly 600. The connection structural member 30 used for the probe card assembly 600 may be referred to as a pogo pin.

The wafer testing apparatus 1 according to an embodiment may include the connection structural member 30, the first piezoelectric sensor 521, and the second piezoelectric sensor 521a and may reliably connect the support board 11 and the circuit board 12 mechanically and electrically with reduced or eliminated eccentricity.

Since, in the wafer testing apparatus 1 according to an embodiment, the circuit board levelling portions 20 are disposed in the upper surface of the connection plate 14, it is possible to allow the conductive portions 50 to come into contact with the electrode pads U at a predetermined contact load even when the conductive portions 50 come into contact with the electrode pads U at different heights.

Since, in the wafer testing apparatus 1 including the probe card assembly 600 according to an embodiment, the plate spring members 24 fixing a position of the support board 11 in a horizontal direction are disposed in the outer peripheral portion of the connection plate 14, it is possible to move the support board 11 only in a vertical direction without movement of the support board 11 in a horizontal direction even when the support board 11 is subjected to force in a horizontal direction in a state in which the card-type probe 10 comes into contact with the electrode pad U. Therefore, it is possible to allow the conductive portions 50 to appropriately come into contact with the electrode pads U.

The wafer testing apparatus 1 including the probe card assembly 600 according to an embodiment may include the circuit board load sensor 23 which measures a load on the circuit board 12 in the circuit board levelling portion 20. Therefore, the load controller 100 may perform control such that a load on the circuit board 12 is equal to or within a range of a predetermined value, based on a measurement result of the circuit board load sensor 23. Accordingly, it is possible to allow the conductive portion 50 to appropriately come into contact with the electrode pad U by the load controller 100 even when a contact load having an abnormal value occurs between the conductive portion 50 and the electrode pad U.

Figure 18:
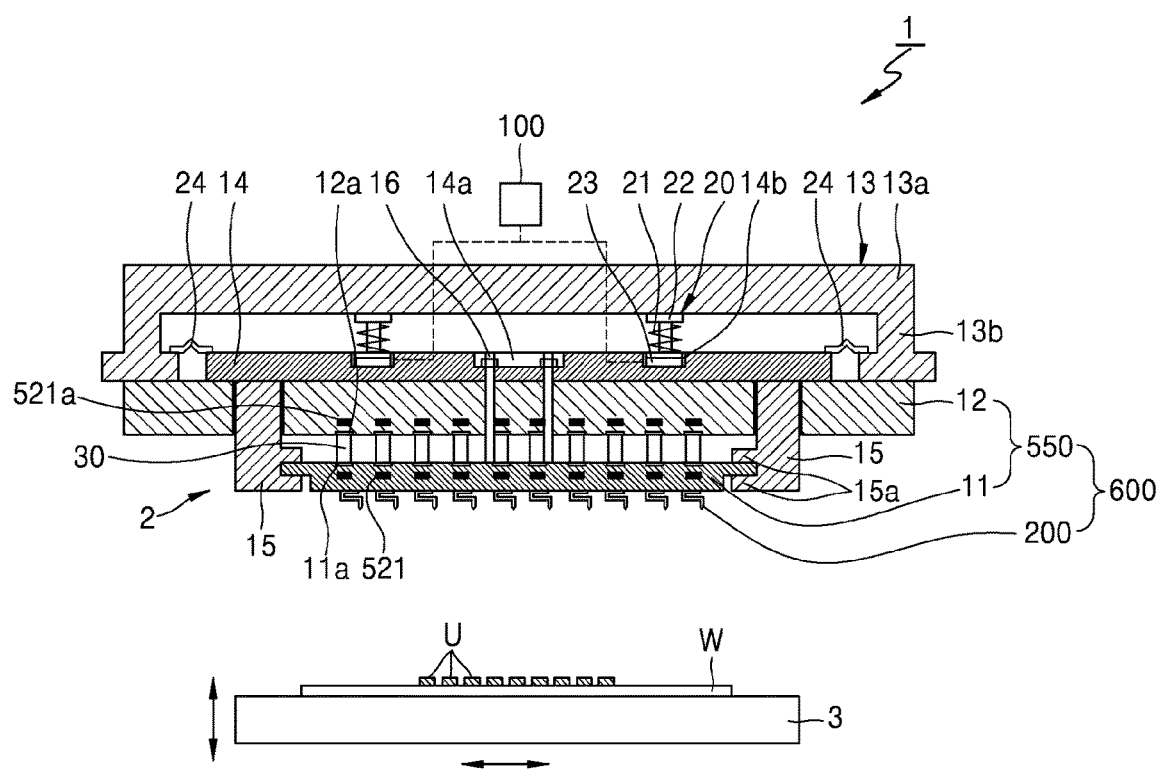
FIG. 18 is an enlarged cross-sectional view of a wafer testing apparatus including a probe card assembly of FIGS. 12 and 13.
Figure 19:
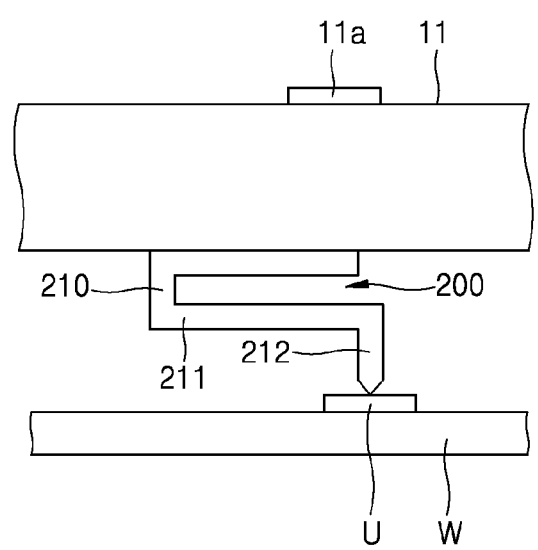
FIG. 19 is a cross-sectional view illustrating a contact state between a cantilever-type probe of FIG. 18 and a wafer.

FIG. 18 is an enlarged cross-sectional view of a wafer testing apparatus 1 including the probe card assembly of FIGS. 12 and 13. FIG. 19 is a cross-sectional view illustrating a contact state between a cantilever-type probe of FIG. 18 and a wafer.

The wafer testing apparatus 1 of FIG. 18 is substantially identical to those of FIGS. 14 and 15, except that the wafer testing apparatus 1 includes a cantilever-type probe 200. The cantilever-type probe 200 illustrated in FIG. 18 may have a cantilever structure. A support board 11 including the cantilever-type probe 200 may be disposed under a circuit board 12.

Multiple cantilever-type probes 200 may be disposed in a lower surface of the support board 11 at positions corresponding to electrode pads U on the wafer W. The cantilever-type probe 200 may be electrically connected to a connection pad 11a disposed on an upper surface of the support board 11.

As illustrated in FIG. 19, the cantilever-type probe 200 may have a support portion 210 protruding from the lower surface of the support board 11. A cantilever portion 211 may be disposed at a lower end of the support portion 210. A contact 212 extending downward in a perpendicular direction to the cantilever portion 211 may be disposed at a free end of the cantilever portion 211.

In the wafer testing apparatus 1 of FIGS. 18 and 19, the support board 11, the circuit board 12, a connection structural member 30, a first piezoelectric sensor 521, and a second piezoelectric sensor 521a may constitute a connection structural member module 550. Also, in the wafer testing apparatus 1 of FIGS. 18 and 19, the support board 11, the circuit board 12, the connection structural member 30, the first piezoelectric sensor 521, the second piezoelectric sensor 521a, and the cantilever-type probe 200 may constitute a probe card assembly 600.

Figure 20:
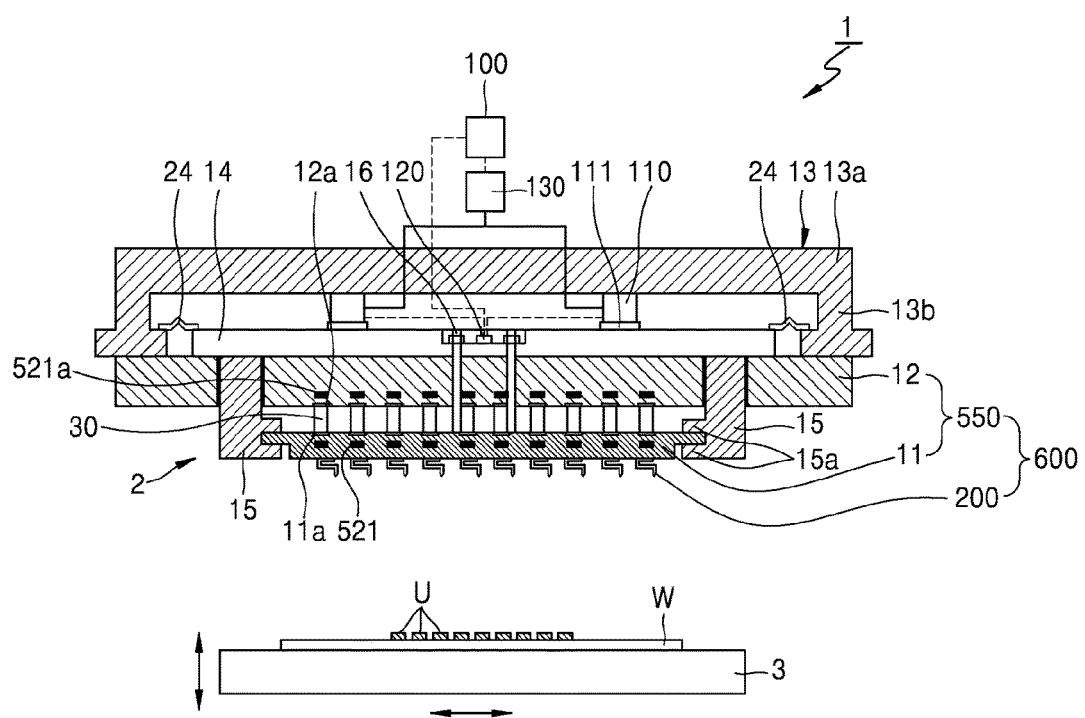
FIG. 20 is an enlarged cross-sectional view of a wafer testing apparatus including a probe card assembly of FIGS. 12 and 13.

FIG. 20 is an enlarged cross-sectional view of a wafer testing apparatus 1 including a probe card assembly of FIGS. 12 and 13. The wafer testing apparatus 1 of FIG. 20 may be substantially identical to the wafer testing apparatus of FIG. 18, except that the wafer testing apparatus 1 includes a circuit board actuator 110, which is a circuit board load adjustment member constituting a circuit board levelling portion 20, and a circuit board load sensor 120.

The circuit board actuator 110 of the wafer testing apparatus 1 may be connected to the circuit board load sensor 120, which is configured to measure a load of the circuit board 12. The circuit board load sensor 120 may be connected to a load controller 100. The circuit board actuator 110 may be connected to a flow controller 130. The load controller 100 may be connected to the flow controller 130. The load controller 100 may be configured to perform control such that a contact load between a card-type probe 10 and an electrode pad is substantially uniform, by adjusting a pressure of air from the flow controller 130 based on a measurement result of the circuit board load sensor 120.

As described above, in the wafer testing apparatus 1 of FIG. 20, the support board 11, the circuit board 12, the connection structural member 30, the first piezoelectric sensor 521, and the second piezoelectric sensor 521a may constitute a connection structural member module 550. Also, in the wafer testing apparatus 1 of FIG. 20, the support board 11, the circuit board 12, the connection structural member 30, the first piezoelectric sensor 521, the second piezoelectric sensor 521a, and the cantilever-type probe 200 may constitute the probe card assembly 600.

Figure 21:
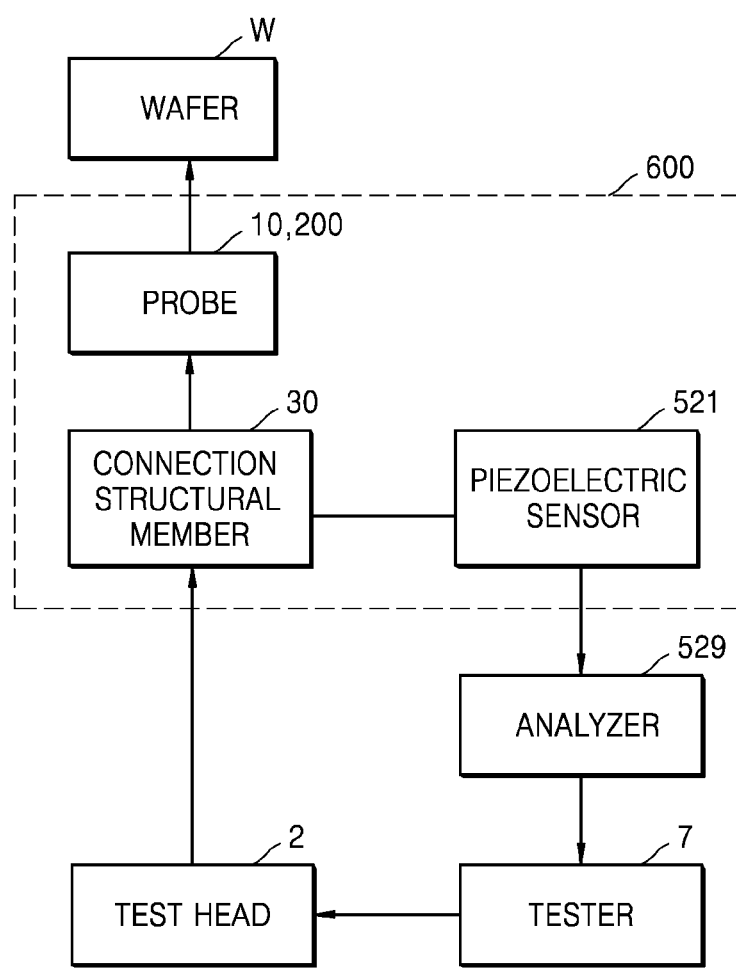
FIG. 21 is a block diagram illustrating a configuration and an electrical signal flow of a wafer testing apparatus, according to an embodiment.
Figure 22:
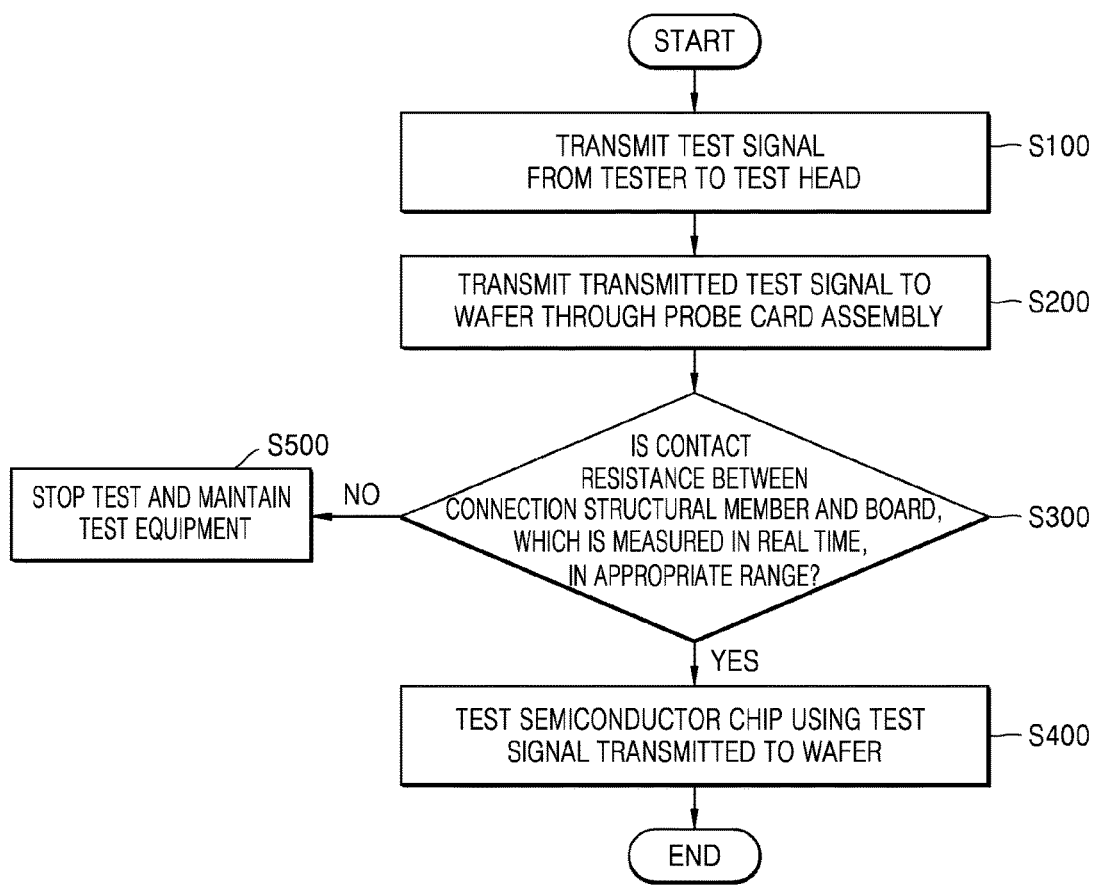
FIG. 22 is a flowchart of a test method of a wafer testing apparatus, according to an embodiment.

FIG. 21 is a block diagram illustrating a configuration and an electrical signal flow of a wafer testing apparatus, according to an embodiment. FIG. 22 is a flowchart of a test method of a wafer testing apparatus, according to an embodiment.

The wafer testing apparatus may include a tester 7, which may be configured to generate a test signal for testing electrical characteristics of a semiconductor chip provided in a wafer W. The test signal generated by the tester 7 may be transmitted to a test head 2 (operation S100).

The transmitted test signal may be transmitted to the semiconductor chip provided in the wafer W through the probe card assembly 600 (operation S200). The transmitted test signal may be applied to the semiconductor chip of the wafer W by sequentially passing through the connection structural member module 550 and the probe 10 or 200, which constitute the probe card assembly 600.

When a test is performed in a state in which the probe 10 or 200 comes into electrical contact with the semiconductor chip provided in the wafer W, contact resistances between connection structural members, such as 30 in FIG. 14, and boards 11 and 12, such as in FIG. 14 may be measured and a determination may be performed as to whether the contact resistances are in an appropriate range (operation S300). In other words, the contact resistances between the connection structural members, such as 30 in FIG. 14, and the support board, such as 11 in FIG. 14, and the circuit board, such as 12 in FIG. 14, may be measured by using the first piezoelectric sensor 521. A measured result may be transmitted to the analyzer 529 and the tester 7 and a determination may be performed as to whether the measured result is in an appropriate range.

When the contact resistance transmitted to the analyzer 529 and the tester 7 is in the appropriate range, the semiconductor chip may be tested by using the test signal transmitted to the wafer (operation S400). When the contact resistance transmitted to the analyzer 529 and the tester 7 is not in the appropriate range, test for the semiconductor chip provided in the wafer may be stopped by using the tester 7 (operation S500). The contact resistance analyzed by the analyzer 529 may be input to the tester 7 and may be used to control wafer test based on the appropriate range.

As described above, the wafer testing apparatus according to an embodiment may include the probe card assembly 600 which includes the probe 10 or 200, the connection structural member 30, and the first piezoelectric sensor 521. As a result, testing a chip provided in the wafer W, such as a memory chip, may be more reliably performed in real time.

Applications of a semiconductor chip manufactured by the wafer testing apparatus 1 according to an embodiment will be described below. The applications of a semiconductor chip to be described below are examples and other embodiments include other applications.

Figure 23:
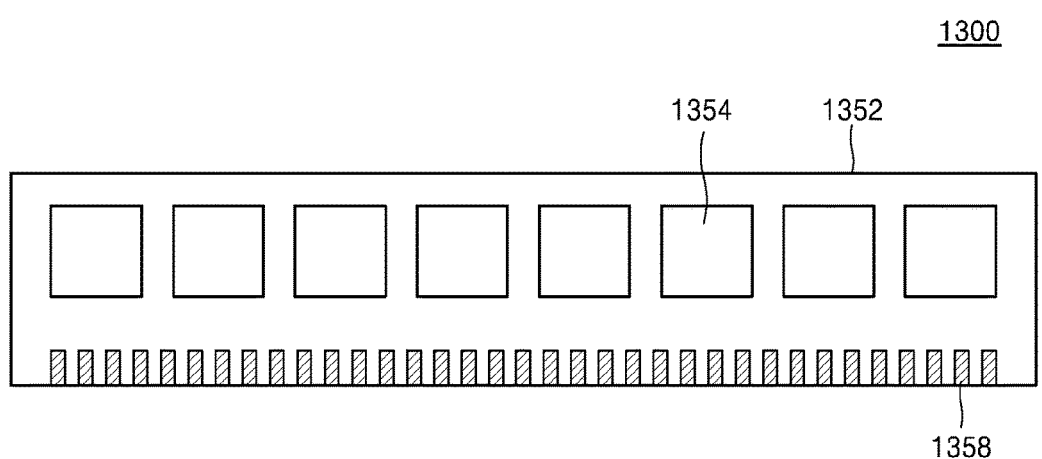
FIG. 23 is a plan view illustrating a semiconductor module including a semiconductor chip manufactured by a wafer testing apparatus according to an embodiment.

FIG. 23 is a plan view illustrating a semiconductor module including a semiconductor chip manufactured by a wafer testing apparatus according to an embodiment.

The semiconductor module 1200 may include a module board 1352, multiple semiconductor packages 1354 disposed on the module board 1352, and contact terminals 1358 formed in an edge of the module board 1352 in a line and electrically connected to the semiconductor packages 1354 respectively.

The module board 1352 may be a printed circuit board (PCB). Both surfaces of the module board 1352 may be used. That is, the semiconductor packages 1354 may be disposed on both the front surface and rear surface of the module board 1352. Although eight semiconductor packages 1354 are illustrated as being disposed on the front surface of the module board 1352, other embodiments may include different numbers of semiconductor packages 1354. The semiconductor module 1300 may further include a separate semiconductor package for controlling the semiconductor packages 1354.

At least one of the semiconductor packages 1354 may include a semiconductor chip manufactured according to one or more embodiments similar to those described above. Each of the module contact terminals 1358 may be formed of a metal and may have oxidation resistance. The module contact terminals 1358 may be variously set according to standards of the semiconductor module 1300. Therefore, the number of the illustrated module contact terminals 1358 is merely an example.

Figure 24:
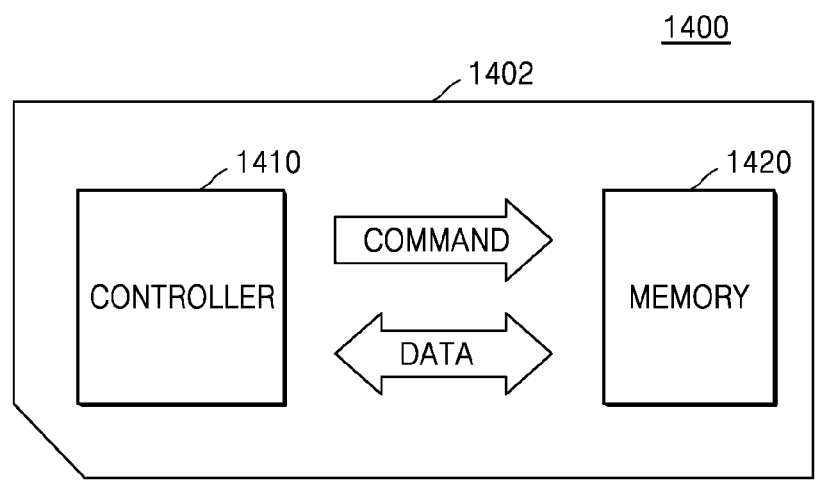
FIG. 24 is a diagram illustrating a card including a semiconductor chip manufactured by a wafer testing apparatus according to an embodiment.

FIG. 24 is a diagram illustrating a card 1400 including a semiconductor chip manufactured by a wafer testing apparatus according to an embodiment. The card 1400 may include a controller 1410 and a memory 1420 which are disposed on a circuit board 1402. The controller 1410 and the memory 1420 may be disposed to exchange electrical signals with each other. For example, when the controller 1410 issues a command, the memory 1420 may transmit data. The memory 1420 or the controller 1410 may include a semiconductor chip manufactured by a wafer testing apparatus according to an embodiment. The card 1400 may include various memory cards, such as a memory stick card, a smart media card (SM), a secure digital card (SD), a mini-secure digital card (mini SD), and a multimedia card (MMC).

Figure 25:
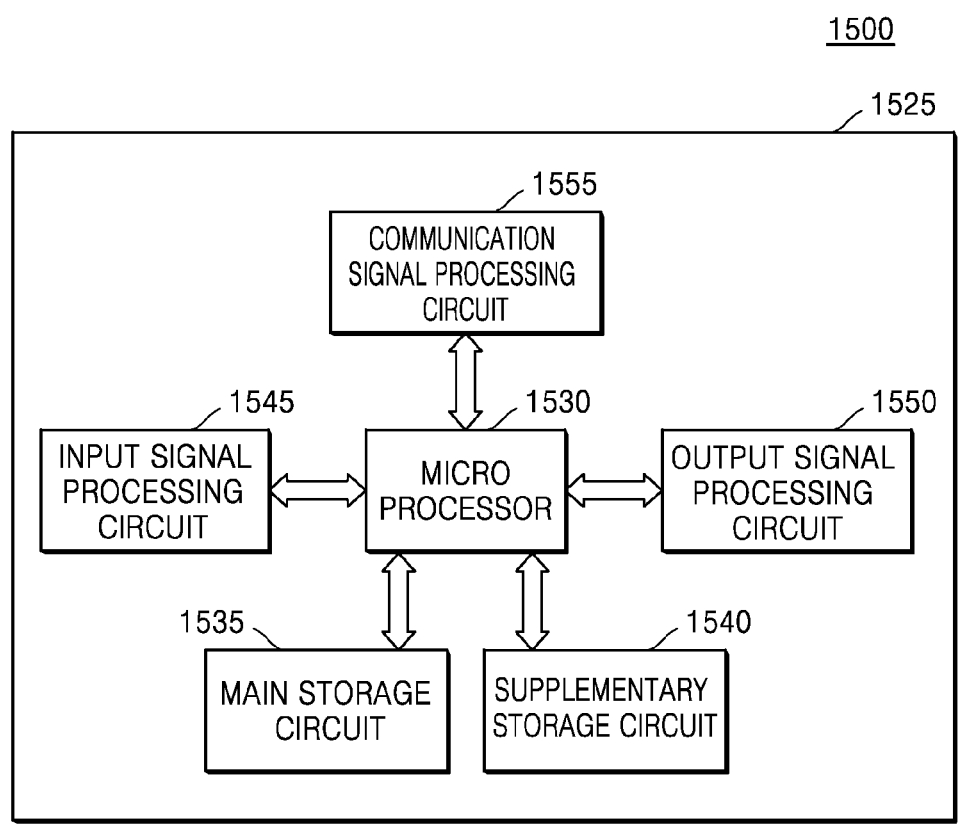
FIG. 25 is a block diagram illustrating an electronic circuit board including a semiconductor chip manufactured by a wafer testing apparatus according to an embodiment.

FIG. 25 is a block diagram illustrating an electronic circuit board including a semiconductor chip manufactured by a wafer testing apparatus according to an embodiment.

The electronic circuit board 1500 may include a microprocessor 1530 disposed on a circuit board 1525, a main storage circuit 1535 and a supplementary storage circuit 1540 configured to communicate with the microprocessor 1530, an input signal processing circuit 1545 configured to transmit a command to the microprocessor 1530, an output signal processing circuit 1550 configured to receive a command from the microprocessor 1530, and a communication signal processing circuit 1555 configured to transmit/receive an electrical signal to/from other circuit boards. In FIG. 25, arrows may indicate paths through which an electrical signal may be transmitted.

The microprocessor 1530 may be configured to receive and process various electrical signals, output a processing result, and control other elements of the electronic circuit board 1500. The microprocessor 1530 may include a central processing unit (CPU), a main control unit (MCU), or the like.

The main storage circuit 1535 may be configured to temporarily store data always or often requested by the microprocessor 1530 or data before and after processing. The main storage circuit 1535 may include a semiconductor memory chip because the main storage circuit 1535 may use a device with a high speed response. Specifically, the main storage circuit 1535 may include a semiconductor memory called a cache, and examples of the main storage circuit 1535 may include a static random access memory (SRAM), a dynamic random access memory (DRAM), a resistive random access memory (RRAM), applications of semiconductor memory devices, such as a utilized RAM, a ferroelectric RAM, a fast cycle RAM, a phase-changeable RAM, and a magnetic RAM, and other semiconductor memories.

In addition, the main storage circuit 1535 may be volatile or non-volatile and may be a RAM. In this embodiment, the main storage circuit 1535 may include a semiconductor chip according to an embodiment. The supplementary storage circuit 1540 may be a large capacity storage device and may include a non-volatile semiconductor memory, such as a flash memory, or a hard disc drive using a magnetic storage medium. Alternatively, the supplementary storage circuit 1540 may include a compact disc drive using an optical storage medium. The supplementary storage circuit 1540 may have a lower speed than the main storage circuit 1535, and may be used to store a large amount of data. The supplementary storage circuit 1540 may be random or non-random and may include a non-volatile storage element.

The supplementary storage circuit 1540 may include a semiconductor chip manufactured by a wafer testing apparatus according to an embodiment. The input signal processing circuit 1545 may be configured to convert an external command into an electrical signal, or may transmit an external electrical signal to the microprocessor 1530.

The external command or the external electrical signal may be an operation command, an electrical signal to be processed, or data to be stored. Examples of the input signal processing circuit 1545 may include a terminal signal processing circuit configured to process an on-signal transmitted from a keyboard, a mouse, a touchpad, an image recognition apparatus, or various sensors, an image signal processing circuit configured to process an image signal input from a scanner or a camera, various sensors, and an input signal interface. The input signal processing circuit 1545 may include a semiconductor package or semiconductor module according to an embodiment.

The output signal processing circuit 1550 may be an element for transmitting an electrical signal processed by the microprocessor 1530 to external devices or systems. Examples of the output signal processing circuit 1550 may include a graphics card, an image processor, an optical converter, a beam panel card, and an interface circuit having various functions. The output signal processing circuit 1550 may include a semiconductor chip according to an embodiment.

The communication signal processing circuit 1555 is an element for directly transmitting/receiving an electrical signal to/from another electronic system or another circuit board without the input signal processing circuit 1545 or the output signal processing circuit 1550. Examples of the communication signal processing circuit 1555 may include a modem of a personal computer system, a local area network (LAN) card, and various interface circuits. The communication signal processing circuit 1555 may include a semiconductor chip manufactured by a wafer testing apparatus according to an embodiment.

Figure 26:
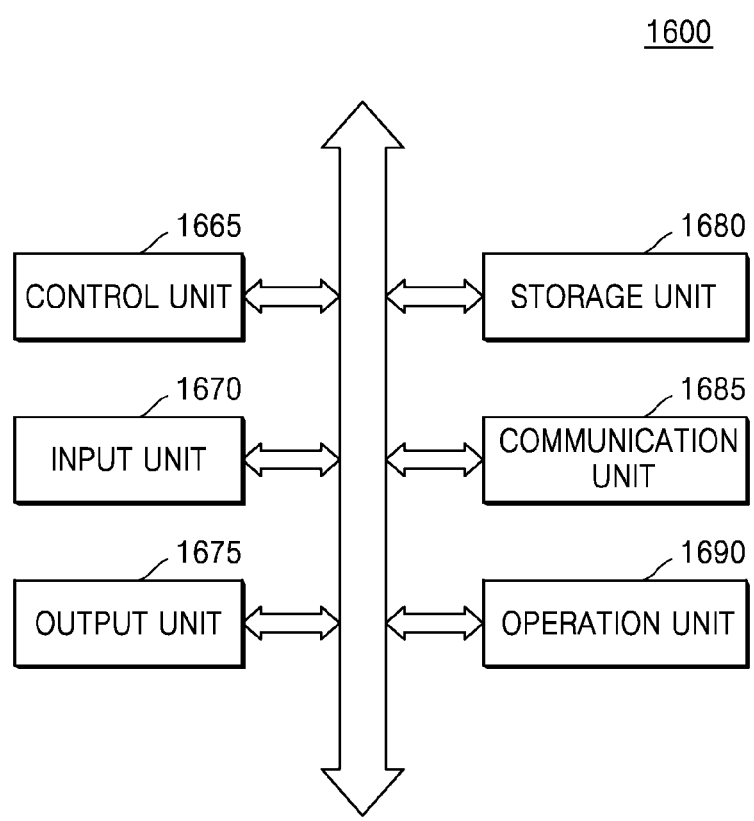
FIG. 26 is a block diagram illustrating an electronic system including a semiconductor chip manufactured by a wafer testing apparatus according to an embodiment.

FIG. 26 is a block diagram illustrating an electronic system including a semiconductor chip manufactured by a wafer testing apparatus according to an embodiment.

The electronic system 1600 may include a control unit 1665, an input unit 1670, an output unit 1675, and a storage unit 1680, and may further include a communication unit 1685 and/or an operation unit 1690.

The control unit 1665 may be configured to control overall operations of elements of the electronic system 1600. The control unit 1665 may include, for example, a CPU or a central control unit, and may include an electronic circuit board, such as 1500 in FIG. 25, according to an embodiment. The control unit 1665 may include a semiconductor chip manufactured by a wafer testing apparatus according to an embodiment.

The input unit 1670 may be configured to transmit an electrical command signal to the control unit 1665. Examples of the input unit 1670 may include a keyboard, a keypad, a mouse, a touchpad, an image recognizer such as a scanner, and various input sensors. The input unit 1670 may include a semiconductor chip manufactured by a wafer testing apparatus according to an embodiment.

The output unit 1675 may be configured to receive an electrical command signal from the control unit 1665 and output a processing result of the electronic system 1600. Examples of the output unit 1675 may include a monitor, a printer, a beam irradiator, and various mechanical apparatuses. The output unit 1675 may include a semiconductor chip manufactured by a wafer testing apparatus according to an embodiment.

The storage unit 1680 may be an element for temporarily or permanently storing an electrical signal processed or to be processed by the control unit 1665. The storage unit 1680 may be physically or electrically connected or coupled to the control unit 1665. Examples of the storage unit 1680 may include a magnetic storage device, such as a semiconductor memory or a hard disc, an optical storage device, such as a compact disc, and a server having a storage function. The storage unit 1680 may include a semiconductor chip manufactured by a wafer testing apparatus according to an embodiment.

The communication unit 1685 may be configured to receive an electrical command signal from the control unit 1665 and transmit/receive an electrical signal to/from another electronic system. Examples of the communication unit 1685 may include a wired transmitter/receiver, such as a modem or a LAN card, a wireless transmitter/receiver such as a WiBro interface, and an infrared port. The communication unit 1685 may include a semiconductor chip manufactured by a wafer testing apparatus according to an embodiment.

The operation unit 1690 may perform a physical or mechanical operation according to a command of the control unit 1665. For example, the operation unit 1690 may be an element that performs a mechanical operation, such as a plotter, an indicator, or an up/down operator. Examples of the electronic system 1600 may include a computer, a network server, a networking printer or scanner, a wireless controller, a mobile communication terminal, a switching device, and other electronic products each performing a programmed operation.

The electronic system 1600 may be used for a mobile phone, an MP3 player, a navigation device, a portable multimedia player (PMP), a solid state disc (SSD), household appliances, or other applications.

Figure 27:
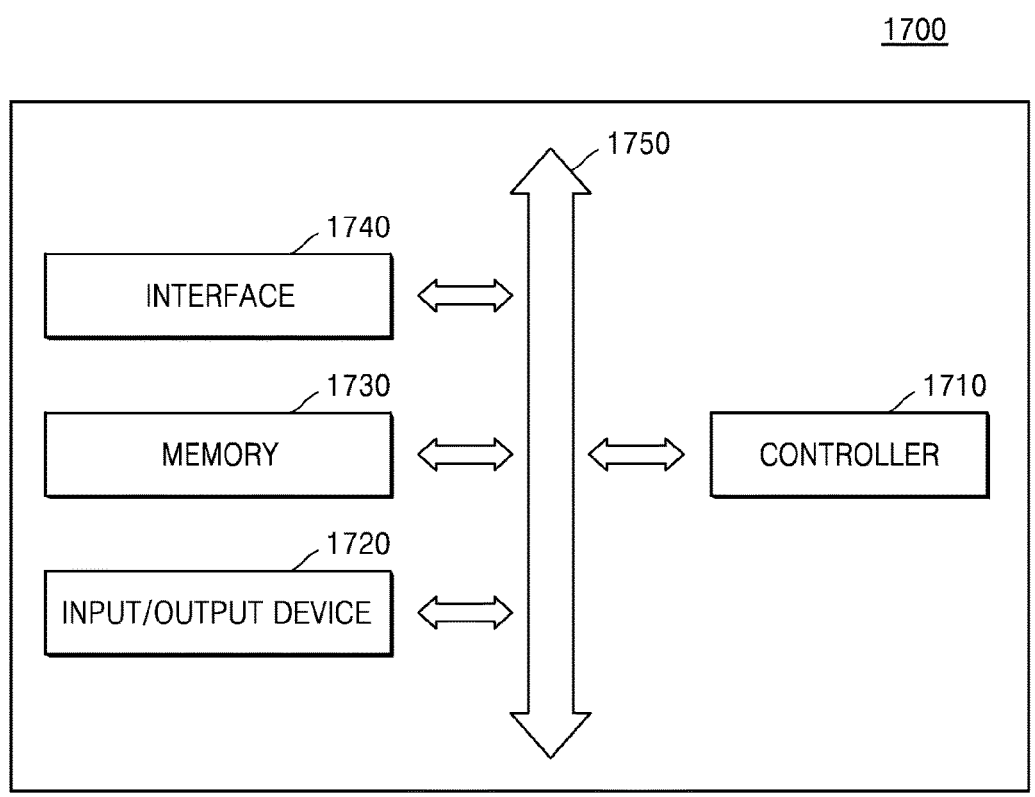
FIG. 27 is a diagram illustrating an electronic system including a semiconductor chip manufactured by a wafer testing apparatus according to an embodiment.

FIG. 27 is a diagram illustrating an electronic system including a semiconductor chip manufactured by a wafer testing apparatus according to an embodiment.

The electronic system 1700 may include a controller 1710, an input/output device 1720, a memory 1730, and an interface 1740. The electronic system 1700 may be, for example, a mobile system or a system that transmits or receives information. Examples of the mobile system may include a personal digital assistant (PDA), a portable computer, a web tablet, a wireless phone, a mobile phone, a digital music player, and a memory card.

The controller 1710 may execute a program and control the electronic system 1700. The controller 1710 may include a semiconductor chip manufactured by a wafer testing apparatus according to an embodiment. Examples of the controller 1710 may include a microprocessor, a digital signal processor and a microcontroller and its similar device.

The input/output device 1720 may be configured to be used to input and output data of the electronic system 1700. The electronic system 1700 may be connected to an external device, for example, a personal computer or a network, by using the input/output device 1720 and may exchange data with the external device. Examples of the input/output device 1720 may include a keypad, a keyboard, and a display.

The memory 1730 may be configured to store codes and/or data for operations of the controller 1710 and/or may store data processed by the controller 1710. The memory 1730 may include a semiconductor chip manufactured by a wafer testing apparatus according to an embodiment. The interface 1740 may be a data transmission path between the electronic system 1700 and another external device. The controller 1710, the input/output device 1720, the memory 1730, and the interface 1740 may communicate with one another through a bus 1750.

For example, the electronic system 1700 may be used for a mobile phone, an MP3 player, a navigation device, a PMP, an SSD, or household appliances.

Figure 28:
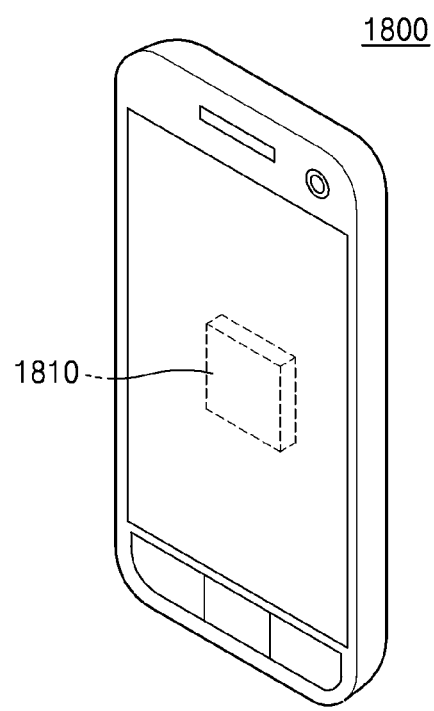
FIG. 28 is a perspective view illustrating an electronic device including a semiconductor chip manufactured by a wafer testing apparatus according to an embodiment.

FIG. 28 is a perspective view illustrating an electronic device including a semiconductor chip manufactured by a wafer testing apparatus according to an embodiment.

An example in which the electronic system 1700 of FIG. 27 is applied to the mobile phone 1800 is illustrated. The mobile phone 1800 may include a system-on chip 1810. The system on-chip 1810 may include a semiconductor chip manufactured by a wafer testing apparatus according to an embodiment. The mobile phone 1800 may include the system-on chip 1810 on which a relatively high performance main functional block may be disposed, and therefore, include relatively high performance. Also, since the system-on chip 1810 is capable of having relatively high performance the same area, it is possible to accomplish a reduction in size of the mobile phone 1800 and allow the mobile phone 1800 to have relatively high performance.

Embodiments include a connection structural member and a connection structural member module which are capable of reliably connecting structural members mechanically and electrically.

Embodiments include a probe card assembly and a wafer testing apparatus which use a connection structural member and a connection structural member module.

Embodiments include a connection structural member including: a barrel having an upper hole and a lower hole corresponding to the upper hole; a first plunger disposed in one of the upper hole and the lower hole and configured to have a hook shape; a second plunger disposed in the other of the upper hole and the lower hole corresponding to the first plunger; and an elastic connection member disposed within the barrel to connect the first plunger and the second plunger.

The first plunger may include a first hook-type plunger body disposed within the barrel and having a diameter larger than diameters of the upper hole and the lower hole and a first hook member connected to the first hook-type plunger body, protruding outside the barrel, and having a first inner spatial area. The first inner spatial area of the first hook member may be provided with a first connection ball.

The second plunger may be a plunger configured to have a pin-type or a plunger configured to have a hook-type. The second plunger configured to have the pin-type may include a pin-type plunger body disposed within the barrel and having a diameter larger than diameters of the upper hole and the lower hole and a pin-type member connected to the pin-type plunger body and protruding outside the barrel.

The second plunger configured to have the hook-type may include a second hook-type plunger body disposed within the barrel and having a diameter larger than diameters of the upper hole and the lower hole and a second hook member connected to the second hook-type plunger body, protruding outside the barrel, and having a second inner spatial area. A second connection ball may be disposed in the second inner spatial area of the second hook member.

The elastic connection member may be spaced apart from the barrel and may be formed of a spring member.

Embodiments include a connection structural member module including: a first structural member; a second structural member disposed corresponding to the first structural member; a connection structural member disposed between the first structural member and the second structural member to connect the first structural member and the second structural member; and a piezoelectric sensor disposed in at least one of the first structural member and the second structural member, wherein the connection structural member includes a first plunger disposed at one end of a barrel and configured to have a hook shape, a first connection ball formed in a first hook member of the first plunger, a second plunger disposed at the other end of the barrel corresponding to the first plunger; and an elastic connection member disposed within the barrel to connect the first plunger and the second plunger.

The barrel may have an upper hole and a lower hole corresponding to the upper hole. The first plunger configured to have the hook-type may be disposed in one of the upper hole and the lower hole and the second plunger may be disposed in the other of the upper hole and the lower hole corresponding to the first plunger.

The first plunger includes a first hook-type plunger body disposed within the barrel and having a diameter larger than diameters of the upper hole and the lower hole. The first hook member may be connected to the first hook-type plunger body and may protrude outside the barrel. The first connection ball may be formed in the first hook member.

The second plunger may be a plunger configured to have a pin-type or a plunger configured to have a hook-type. The second plunger configured to have the pin-type may include a pin-type plunger body disposed within the barrel and having a diameter larger than diameters of the upper hole and the lower hole and a pin-type member connected to the pin-type plunger body and protruding outside the barrel.

The second plunger configured to have the hook-type may include a second hook-type plunger body disposed within the barrel and having a diameter larger than diameters of the upper hole and the lower hole, a second hook member connected to the second hook-type plunger body, protruding outside the barrel, and a second connection ball formed in the second hook member.

One of the first structural member and the second structural member may be provided with a first connection pad. The first plunger configured to have the hook-type may be connected to the first connection ball in such a way that the first plunger comes into surface contact with the first connection ball.

The other of the first structural member and the second structural member, corresponding to the first connection pad, may be provided with a second connection pad. The second plunger configured to have the hook-type may be connected to the second connection ball in such a way that the second plunger comes into surface contact with the second connection ball.

The other of the first structural member and the second structural member, corresponding to the first connection pad, is provided with a second connection pad. The second plunger configured to have the pin-type may be connected to the second connection pad in such a way that the second plunger comes into point contact with the second connection pad.

The piezoelectric sensor may be disposed in the first structural member or the second structural member corresponding to the connection structural member.

The piezoelectric sensor may be connected to an analyzer capable of analyzing a contact resistance between the first structural member or the second structural member and the connection structural member.

Embodiments include a probe card assembly including a circuit board connected to a test head; a support board disposed to face the circuit board; a connection structural member configured to connect connection pads respectively formed in the circuit board and the support board; an piezoelectric sensor disposed in at least one of the circuit board and the support board; and a probe disposed under the support board and configured to come into contact with an electrode pad of a semiconductor chip on a wafer, wherein the connection structural member includes a first plunger disposed at one end of a barrel and configured to have a hook shape, a second plunger disposed at the other end of the barrel corresponding to the first plunger; and an elastic connection member disposed within the barrel to connect the first plunger and the second plunger.

The barrel constituting the connection structural member may have an upper hole and a lower hole corresponding to the upper hole. The first plunger configured to have the hook-type may be disposed in one of the upper hole and the lower hole and the second plunger may be disposed in the other of the upper hole and the lower hole corresponding to the first plunger.

The second plunger may be a plunger configured to have a pin-type or a plunger configured to have a hook-type.

One of the first structural member and the second structural member may be provided with a first connection pad. A first connection ball may be formed on the first connection pad. The first plunger configured to have the hook-type may be connected to the first connection ball in such a way that the first plunger comes into surface contact with the first connection ball.

The other of the first structural member and the second structural member may be provided with a second connection pad. A second connection ball may be formed on the second connection pad. The second plunger configured to have the hook-type may be connected to the second connection ball in such a way that the second plunger comes into surface contact with the second connection ball.

The other of the first structural member and the second structural member may be provided with a second connection pad. The second plunger configured to have the pin-type may be connected to the second connection pad in such a way that the second plunger comes into point contact with the second connection pad.

The piezoelectric sensor may be disposed in the circuit board or the support board corresponding to the connection structural member. The piezoelectric sensor may be connected to an analyzer capable of analyzing a contact resistance between the circuit board or the support board and the connection structural member. The probe may include a card-type probe or a cantilever-type probe.

Embodiments include a wafer testing apparatus including a test head configured to receive a test signal from a tester; a probe card assembly configured to transmit the test signal from the test head to a semiconductor chip on a wafer.

The probe card assembly may include: a circuit board connected to the test head; a support board disposed to face the circuit board; a connection structural member configured to connect connection pads respectively formed in the circuit board and the support board; an piezoelectric sensor disposed in at least one of the circuit board and the support board; and a probe disposed under the support board and configured to come into contact with an electrode pad of the semiconductor chip on the wafer.

The connection structural member may include a first plunger disposed at one end of a barrel and configured to have a hook shape, a second plunger disposed at the other end of the barrel corresponding to the first plunger; and an elastic connection member disposed within the barrel to connect the first plunger and the second plunger.

The piezoelectric sensor may be connected to an analyzer capable of analyzing a contact resistance between the circuit board or the support board and the connection structural member. The contact resistance analyzed by the analyzer may be input to the tester to control wafer test.

The support board may be configured to support a probe which comes into contact with the wafer on a lower surface thereof. The circuit board may be disposed in an upper surface of the support board to transmit an electrical signal for test to the probe. A connection plate connected to the support board through a connection pillar passing through the circuit board may be disposed in an upper surface of the circuit board.

The connection plate may be provided with a circuit board levelling portion capable of adjusting a level of the circuit board. The circuit board levelling portion may include a circuit board load adjustment member disposed in the connection plate to adjust a load of the probe.

The circuit board load adjustment member may include a circuit board load sensor disposed in the connection plate to measure a load on the circuit board and a spring member disposed on the circuit board load sensor. The circuit board load adjustment member may include a circuit board load sensor disposed in the connection plate to measure a load on the circuit board and a circuit board actuator which adjusts a level of the circuit board.

In the connection structural members according to the embodiments described herein, since at least one of the plungers for connecting the structural members includes the hook member, it is possible to more reliably connect the structural members mechanically and electrically in a vertical direction with reduced or eliminated eccentricity.

Since the connection structural member module includes the connection structural member and the piezoelectric sensor in the structural member, it is possible to measure the contact resistance between the connection structural member and the structural member.

The probe card assembly and the wafer testing apparatus according to various embodiments may connect the circuit board and the support board by using the connection structural member and the structural member. Thus, it is possible to connect the circuit board and the support board with reduced or eliminated eccentricity and measure the contact resistance between the connection structural member and the boards.

While embodiments have been particularly shown and described with reference to particular embodiments, it will be understood that various changes in form and details may be made therein without departing from the spirit and scope of the following claims.

What is claimed is:

1. An apparatus comprising:
   a barrel having a first hole and a second hole opposite to the first hole;
   a first plunger disposed in the first hole,
   wherein the first plunger comprises:
      a body disposed within the barrel and having a diameter larger than a diameter of the first hole; and
      a hook member connected to the body and protruding outside the barrel through the first hole,
      wherein the hook member includes an inner spatial area defined by an inner surface of the hook member and a third hole;
   a second plunger disposed in the second hole;
   an elastic connection member disposed within the barrel to connect the first plunger and the second plunger; and
   a connection ball in a direct contact with the inner surface of the hook member,
   wherein the connection ball includes a top surface in a direct contact with the inner surface of the hook member, the top surface of the connection ball facing toward the body of the first plunger, and a bottom surface protruding through the third hole of the hook member,
   wherein the inner surface of the hook member covers more than ½ of a surface area of the connection ball, and
   wherein the top surface of the connection ball is positioned outside the barrel.

2. The apparatus of claim 1,
   wherein the second plunger is configured as a hook-type plunger and includes:
   a second body disposed within the barrel and having a diameter larger than a diameter of the second hole;
   a second hook member connected to the second body, protruding outside the barrel through the second hole, and defining a second inner spatial area; and
   a second connection ball disposed in the second inner spatial area of the second hook member.

3. The apparatus of claim 1,
   wherein the elastic connection member is spaced apart from the barrel and includes a spring.

4. The apparatus of claim 1,
   wherein the second plunger is configured as a pin-type plunger or a hook-type plunger.

5. The apparatus of claim 4,
   wherein the second plunger is configured as the pin-type plunger and includes:
   a body disposed within the barrel and having a diameter larger than a diameter of the second hole; and
   a pin-type member connected to the body and protruding outside the barrel.

6. The apparatus of claim 4,
   wherein the second plunger configured as the hook-type plunger includes:
   a body disposed within the barrel and having a diameter larger than a diameter of the second hole; and
   a hook member connected to the body and protruding outside the barrel through the second hole,
   wherein the hook member of the second plunger defines an inner spatial area.

7. The apparatus of claim 6, further comprising:
   a connection ball is disposed in the inner spatial area of the hook member.

8. The apparatus of claim 1, further comprising:
a first structural member;
a second structural member;
a connection structural member disposed between the first structural member and the second structural member and configured to connect the first structural member and the second structural member, the connection structural member including the barrel, the first plunger, the second plunger, and the elastic connection member; and
a piezoelectric sensor disposed in at least one of the first structural member and the second structural member.

9. The apparatus of claim 8, wherein:
the first structural member includes a first connection pad;
the first plunger includes:
   a first hook member defining a first inner spatial area and; and
   a first connection ball is disposed in the first inner spatial area; and
the first connection ball is in contact with the first hook member and the first connection pad.

10. The apparatus of claim 9, wherein:
the second structural member includes a second connection pad;
the second plunger includes:
   a second hook member defining a second inner spatial area and; and
   a second connection ball is disposed in the second inner spatial area; and
the second connection ball is in contact with the second hook member and the second connection pad.

11. The apparatus of claim 9, wherein:
the second structural member includes a second connection pad;
the second plunger is configured as a pin-type plunger; and
the second plunger is in point contact with the second connection pad.

12. The apparatus of claim 8, wherein:
the first structural member includes a first connection pad;
the first connection pad contacts the first plunger or the second plunger; and
the piezoelectric sensor is disposed in the first structural member under the first connection pad.

13. The apparatus of claim 12, wherein:
the second structural member includes a second connection pad;
the first connection pad contacts the first plunger;
the second connection pad contacts the second plunger; and
the apparatus further comprises a second piezoelectric sensor disposed in the second structural member under the second connection pad.

14. An apparatus comprising:
a first structural member;
a second structural member; and
a plurality of connection structural members disposed between the first structural member and the second structural member, each connection structural member including:
   a barrel having a first hole and a second hole opposite to the first hole;
   a first plunger disposed in the first hole,
   wherein the first plunger comprises:
      a body disposed within the barrel and having a diameter larger than a diameter of the first hole; and
      a hook member connected to the body and protruding outside the barrel through the first hole,
      wherein the hook member includes an inner spatial area defined by an inner surface of the hook member and a third hole;
   a second plunger disposed in the second hole;
   an elastic connection member disposed within the barrel to connect the first plunger and the second plunger; and
   a connection ball in a direct contact with the inner surface of the hook member,
   wherein the connection ball includes a top surface in a direct contact with the inner surface of the hook member, the top surface of the connection ball facing toward the body of the first plunger, and a bottom surface protruding through the third hole of the hook member,
   wherein the inner surface of the hook member covers more than ½ of a surface area of the connection ball, and
   wherein the top surface of the connection ball is positioned outside the barrel,
wherein the first structural member and the second structural member are electrically connected through the plurality of connection structural members.

15. The apparatus of claim 14,
wherein the elastic connection member of each of the plurality of connection structural members is compressed.

16. The apparatus of claim 14, further comprising a plurality of bolts attached to the second structural member and extending through the first structural member.

17. The apparatus of claim 14, further comprising:
a connection plate disposed on a side of the first structural member opposite to the second structural member;
a plurality of connection pillars connected to the connection plate; and
wherein the second structural member is connected to the connection plate by the connection pillars.

* * * * *